(12) United States Patent
Yamada et al.

(10) Patent No.: US 10,115,459 B1
(45) Date of Patent: Oct. 30, 2018

(54) MULTIPLE LINER INTERCONNECTS FOR THREE DIMENSIONAL MEMORY DEVICES AND METHOD OF MAKING THEREOF

(71) Applicant: SANDISK TECHNOLOGIES LLC, Plano, TX (US)

(72) Inventors: Katsuo Yamada, Yokkaichi (JP); Tomoyasu Kakegawa, Yokkaichi (JP); Peter Rabkin, Cupertino, CA (US); Jayavel Pachamuthu, San Jose, CA (US); Mohan Dunga, Santa Clara, CA (US); Masaaki Higashitani, Cupertino, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/720,556

(22) Filed: Sep. 29, 2017

(51) Int. Cl.
 *G11C 16/06* (2006.01)
 *G11C 13/00* (2006.01)
 (Continued)

(52) U.S. Cl.
 CPC ............ *G11C 13/0002* (2013.01); *B05D 1/26* (2013.01); *B23P 19/04* (2013.01); *H01B 1/02* (2013.01);
 (Continued)

(58) Field of Classification Search
 CPC ............ G11C 13/0007; G11C 13/0026; G11C 13/0028; G11C 13/003; G11C 13/004;
 (Continued)

(56) References Cited

U.S. PATENT DOCUMENTS 5,915,167 A 6/1999 Leedy
7,005,350 B2 2/2006 Walker et al.
(Continued)

FOREIGN PATENT DOCUMENTS

WO WO2002/015277 A1 2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
(Continued)

*Primary Examiner* — Thong Q Le
(74) *Attorney, Agent, or Firm* — The Marbury Law Group PLLC

(57) ABSTRACT

An opening is formed through at least one dielectric material layer. A first metallic liner is formed on a bottom surface and sidewalls of the opening by depositing a first metallic material. A metal portion including an elemental metal or an intermetallic alloy of at least two elemental metals is formed on the first metallic liner. A second metallic liner including a second metallic material is formed directly on a top surface of the metal portion. The first metallic material and the second metallic material differ in composition. The first metallic liner and the second metallic liner contact an entirety of all surfaces of the metal portion. The first and second metallic liners can protect the metal portion from a subsequently deposited dielectric material layer, which may be formed as an air-gap dielectric layer after recessing the at least one dielectric material layer.

19 Claims, 36 Drawing Sheets

(51) Int. Cl.
   *H01B 7/00* (2006.01)
   *H01B 1/02* (2006.01)
   *B23P 19/04* (2006.01)
   *B05D 1/26* (2006.01)
   *H01B 3/16* (2006.01)

(52) U.S. Cl.
   CPC .............. *H01B 3/16* (2013.01); *H01B 7/0009* (2013.01); *G11C 2213/75* (2013.01)

(58) Field of Classification Search
   CPC ............ G11C 13/0069; G11C 13/0097; G11C 2213/51; G11C 2213/52
   See application file for complete search history.

(56) References Cited

U.S. PATENT DOCUMENTS

| | | |
|---|---|---|
| 7,023,739 B2 | 4/2006 | Chen et al. |
| 7,177,191 B2 | 2/2007 | Fasoli et al. |
| 7,221,588 B2 | 5/2007 | Fasoli et al. |
| 7,233,522 B2 | 6/2007 | Chen et al. |
| 7,514,321 B2 | 4/2009 | Mokhlesi et al. |
| 7,575,973 B2 | 8/2009 | Mokhlesi et al. |
| 7,745,265 B2 | 6/2010 | Mokhlesi et al. |
| 7,808,038 B2 | 10/2010 | Mokhlesi et al. |
| 7,848,145 B2 | 12/2010 | Mokhlesi et al. |
| 7,851,851 B2 | 12/2010 | Mokhlesi et al. |
| 8,008,710 B2 | 8/2011 | Fukuzumi |
| 8,053,829 B2 | 11/2011 | Kang et al. |
| 8,349,681 B2 | 1/2013 | Alsmeier et al. |
| 8,575,000 B2 | 11/2013 | Purayath et al. |
| 8,658,499 B2 | 2/2014 | Makala et al. |
| 9,177,966 B1 | 11/2015 | Rabkin et al. |
| 9,356,031 B2 | 5/2016 | Lee et al. |
| 9,419,012 B1 | 8/2016 | Shimabukuro et al. |
| 9,449,982 B2 | 9/2016 | Lu et al. |
| 9,515,085 B2 | 12/2016 | Rabkin et al. |
| 9,576,975 B2 | 2/2017 | Zhang et al. |
| 2007/0210338 A1 | 9/2007 | Orlowski |
| 2007/0252201 A1 | 11/2007 | Kito et al. |
| 2009/0108333 A1 | 4/2009 | Kito et al. |
| 2009/0242967 A1 | 10/2009 | Katsumata et al. |
| 2010/0044778 A1 | 2/2010 | Seol |
| 2010/0112769 A1 | 5/2010 | Son et al. |
| 2010/0120214 A1 | 5/2010 | Park et al. |
| 2010/0155810 A1 | 6/2010 | Kim et al. |
| 2010/0155818 A1 | 6/2010 | Cho |
| 2010/0181610 A1 | 7/2010 | Kim et al. |
| 2010/0207195 A1 | 8/2010 | Fukuzumi et al. |
| 2010/0320528 A1 | 12/2010 | Jeong et al. |
| 2011/0076819 A1 | 3/2011 | Kim et al. |
| 2011/0133606 A1 | 6/2011 | Yoshida et al. |
| 2011/0198687 A1 | 8/2011 | Lee |
| 2011/0266606 A1 | 11/2011 | Park et al. |
| 2011/0280077 A1 | 11/2011 | Fishburn |
| 2012/0001247 A1 | 1/2012 | Alsmeier |
| 2012/0001249 A1 | 1/2012 | Alsmeier |
| 2012/0001250 A1 | 1/2012 | Alsmeier |
| 2012/0092926 A1 | 4/2012 | Whang |
| 2012/0146122 A1 | 6/2012 | Whang et al. |
| 2013/0264631 A1 | 10/2013 | Alsmeier et al. |
| 2013/0313627 A1 | 11/2013 | Lee et al. |
| 2014/0138760 A1 | 5/2014 | Makala et al. |
| 2014/0273373 A1 | 9/2014 | Makala et al. |
| 2016/0141294 A1* | 5/2016 | Peri .................. H01L 21/28512 257/324 |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

U.S. Appl. No. 15/411,152, filed Jan. 20, 2017, SanDisk Technologies, LLC.

U.S. Appl. No. 15/413,034, filed Jan. 23, 2017, SanDisk Technologies LLC.

Endoh et al., "Novel Ultra High Density Memory with a Stacked-Surrounding Gate Transistor (S-SGT) Structured Cell," IEDM Proc. (2001) pp. 33-36.

Tanaka et al., "Bit-Cost Scalable Technology for Low-Cost and Ultrahigh-Density Flash Memory," Toshiba Review, vol. 63, No. 2, 2008, pp. 28-31.

Kimura, M., "3D Cells Make Terabit NAND Flash Possible," Nikkei Electronics Asia, Sep. 17, 2009, 6pgs.

International Search Report and Written Opinion, International Application No. PCT/US2011/042566, issued Jan. 17, 2012.

Invitation to Pay Additional Fees & Partial International Search Report, PCT/US2011/042566, dated Sep. 28, 2011.

Chen et al., "Reliability Characteristics of NiSi Nanocrystals Embedded in Oxide and Nitride Layers for Nonvolatile Memory Application," Applied Physics Letters, 92, 152114 (2008).

Invitation to Pay Additional Search Fees, International Application No. PCT/2013/048508, issued Sep. 18, 2013.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

International Search Report and Written Opinion, International Application No. PCT/US2013/048508, dated Dec. 18, 2013.

Chen et al., "Formation of $NiSi_2/SiN_x$ Compound Nanocrystal for Nonvolatile Memory Application," Thin Solid Films, Elsevier-Sequoia S.A., Lausanne, Switzerland, vol. 518, No. 24, pp. 7324-7327 (2010).

Diaz, "Low-k Dielectrics: Materials and Process Technology," EE518, Penn State University, Apr. 13, 2006.

Saraswat, "Low-k Dielectrics," Department of Electrical Engineering, Stanford University, Jul. 2008.

International Search Report and Written Opinion from the International Searching Authority for International Patent Application No. PCT/US2015/049597, dated Apr. 8, 2016, 17 pages.

Shimizu, H. et al., "CVD of Cobalt-Tungsten Alloy Film as a Novel Copper Diffusion Barrier," Microelectronic Engineering, vol. 106, pp. 91-95, (2013).

Kohn, A. et al., "Characterization of Electrodes Deposited Co(W,P) Thin Films for Encapsulation of Copper Metallization," Materials Science and Engineering, vol. A302, pp. 18-25, (2001).

Tan, T. L. et al., "Low-k Dielectric Breakdown Improvement with Co(W,P) Cap Barrier," Proceedings of 13th IPFA, Singapore, pp. 106-109, (2006).

Lin, W. C. et al., "A Comprehensive Process Engineering on TDDB for Direct Polishing Ultra-Low Dielectric Cu Interconnects at 40nm Technology Node and Beyond," Proceeding IEEE, IPRS11-160-164, pp. 2F.7.1 - 2F.7.5, (2011).

* cited by examiner

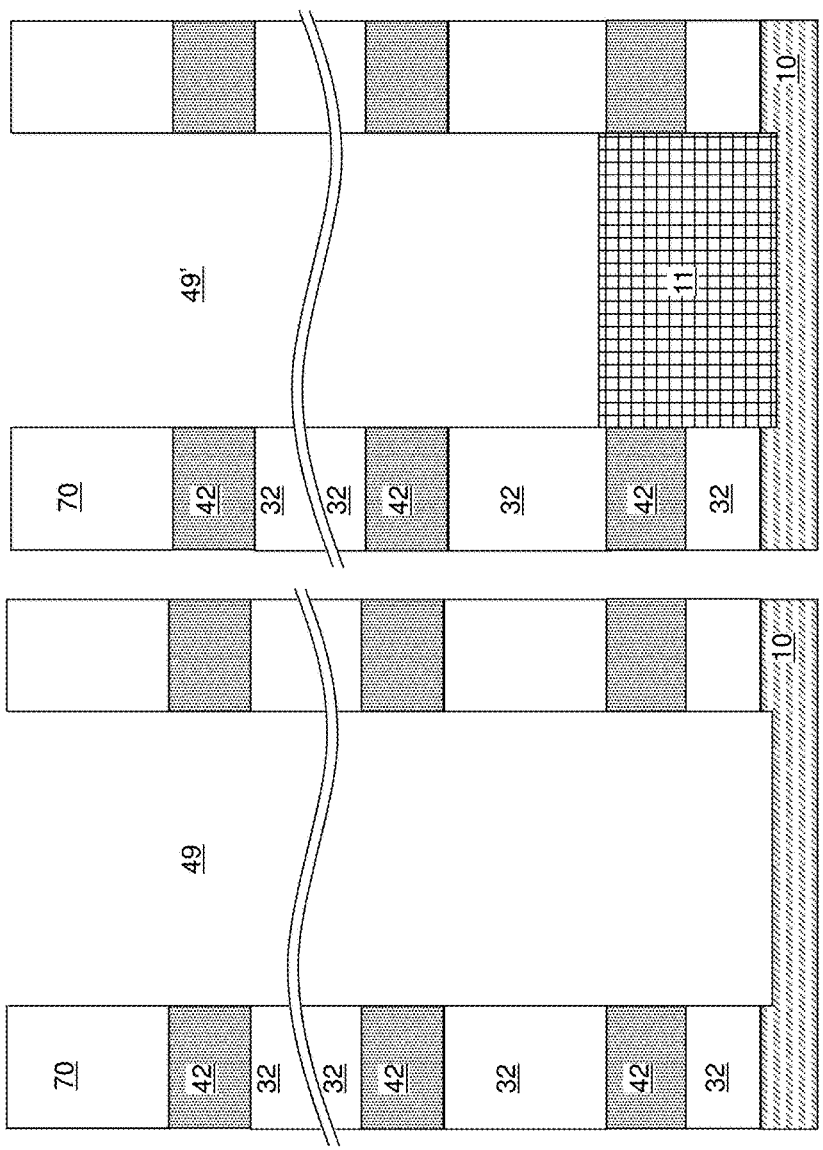

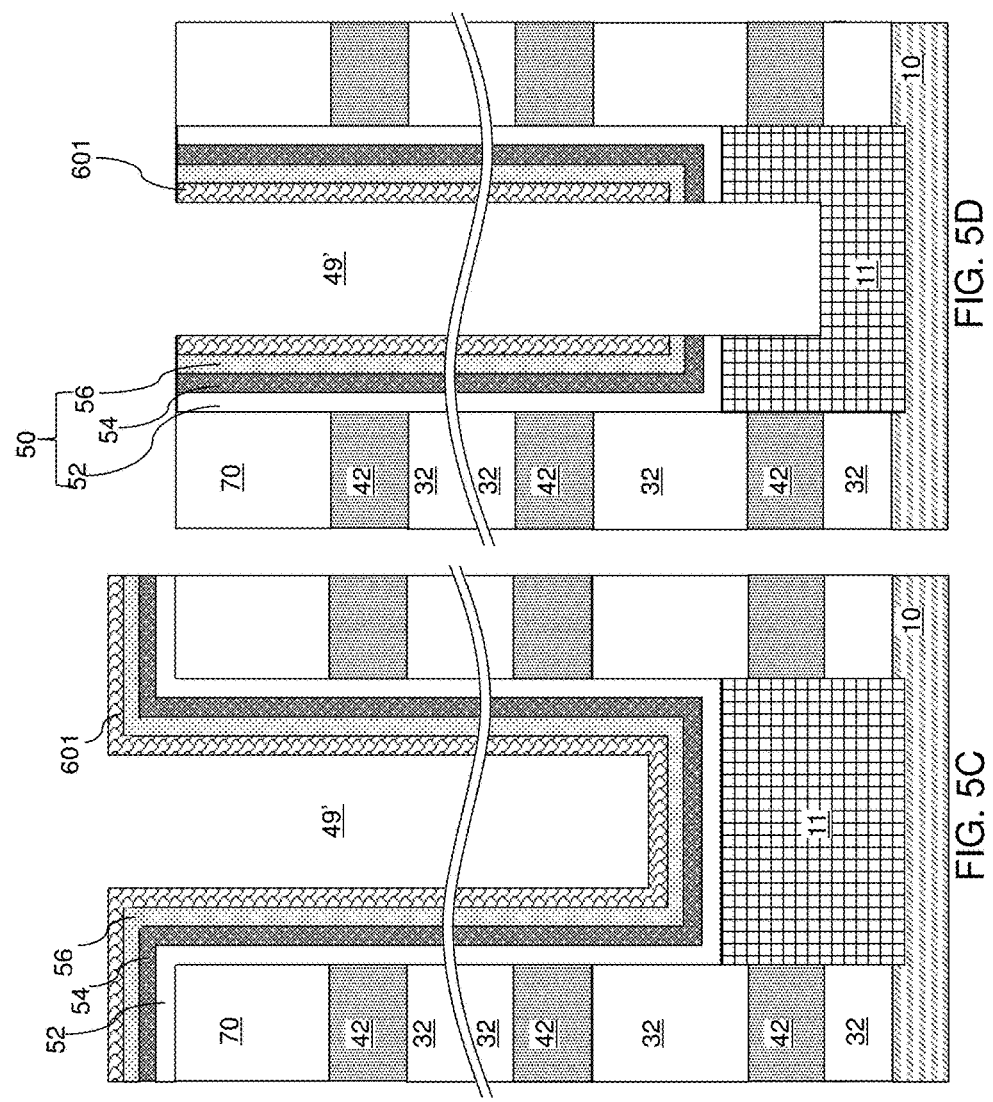

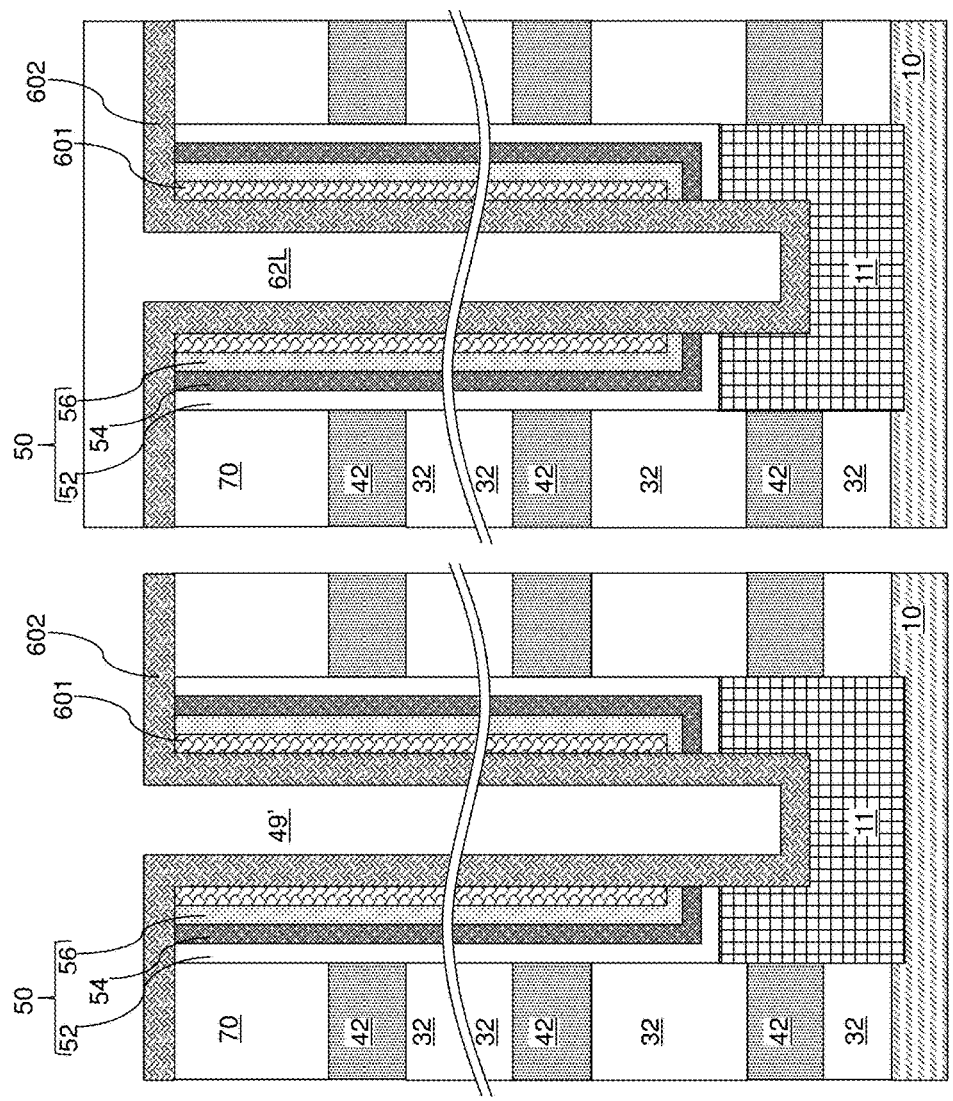

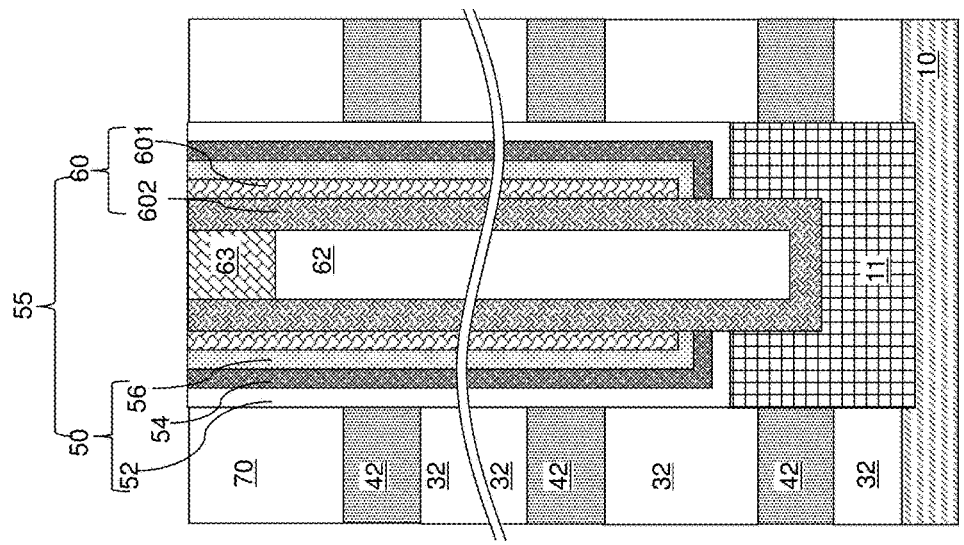
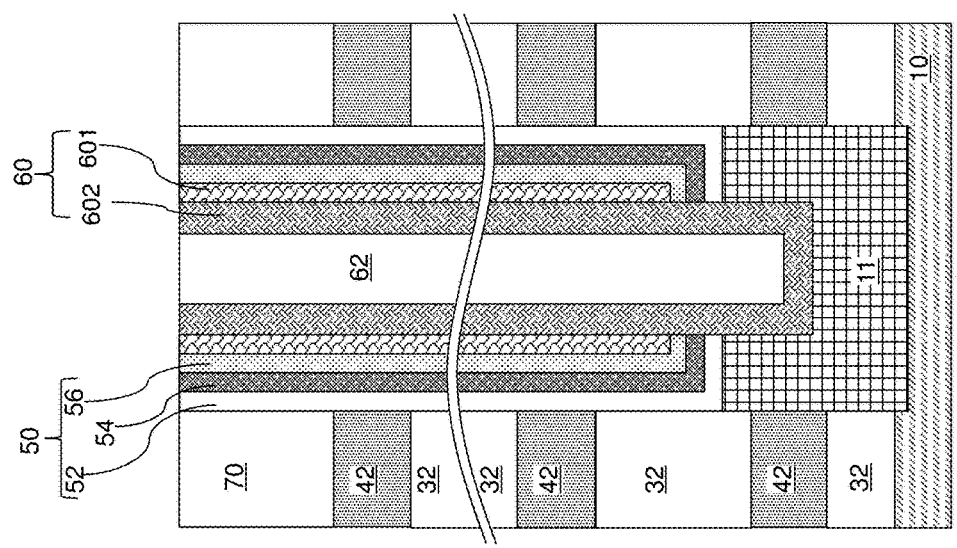

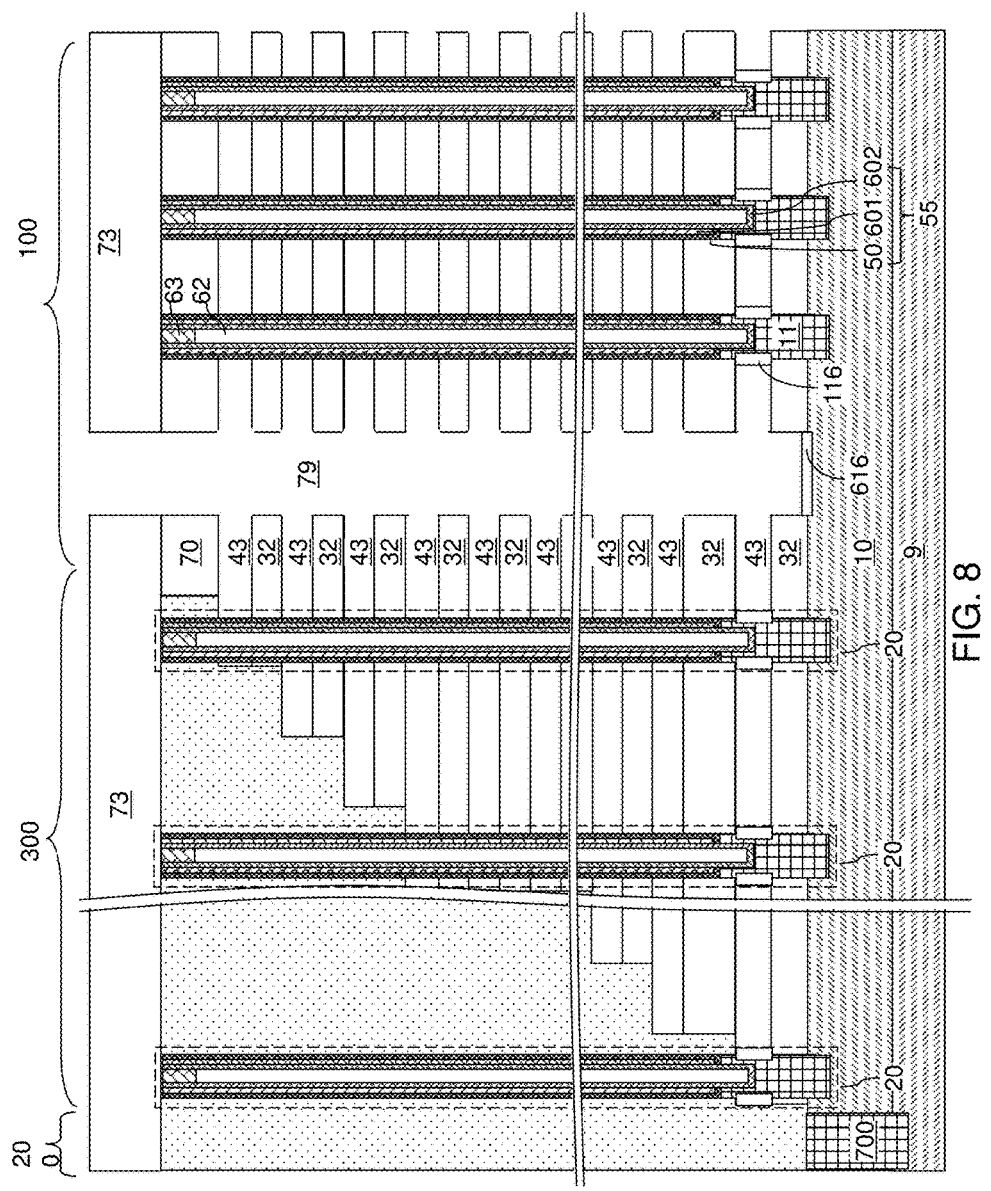

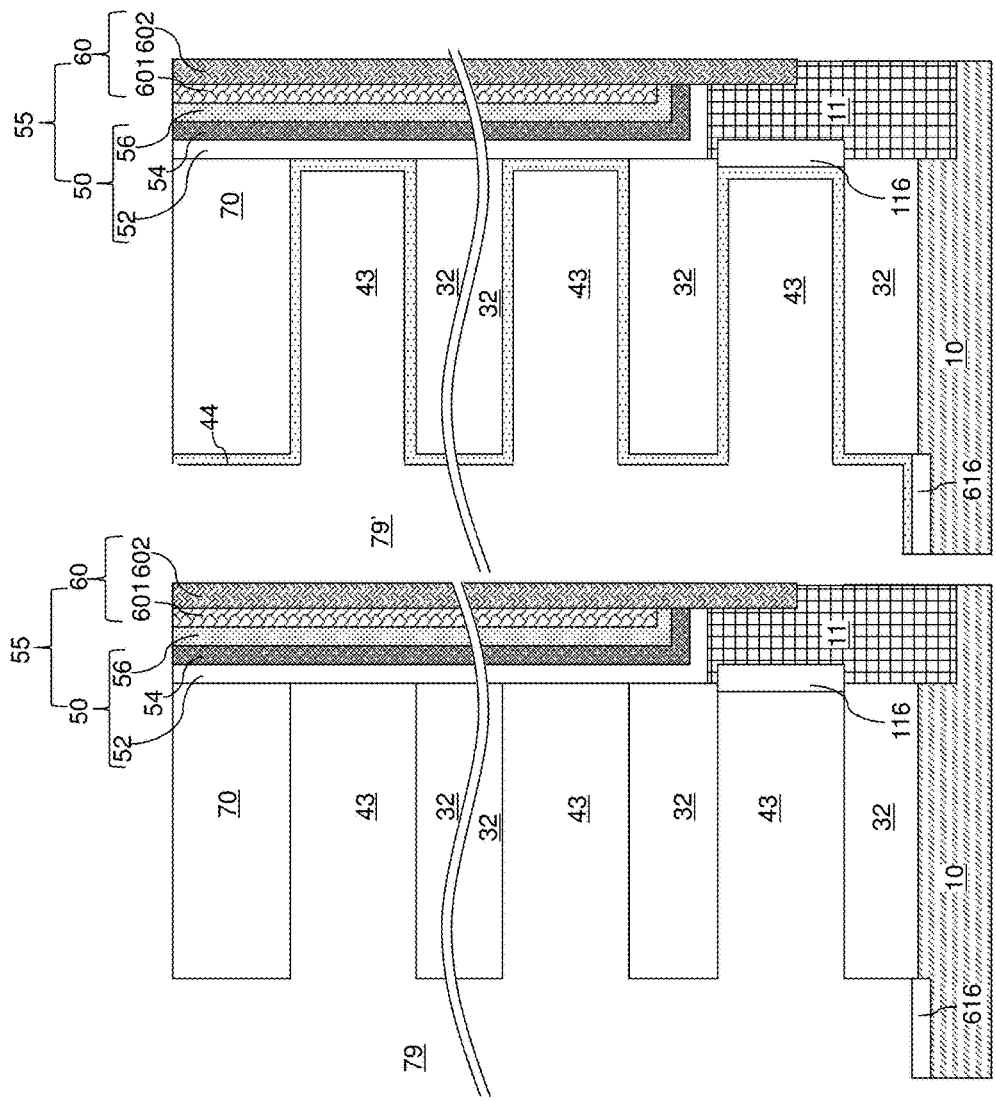

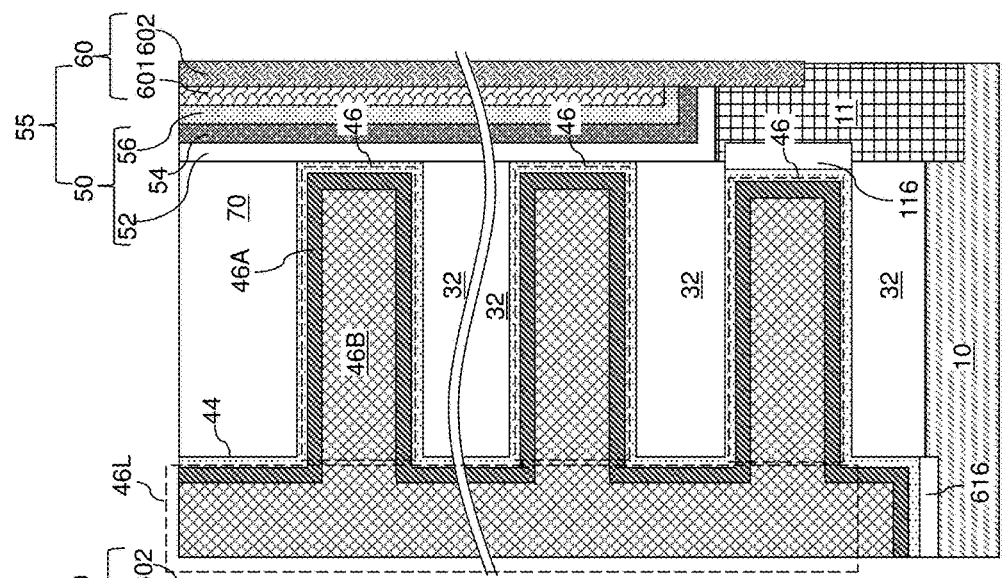
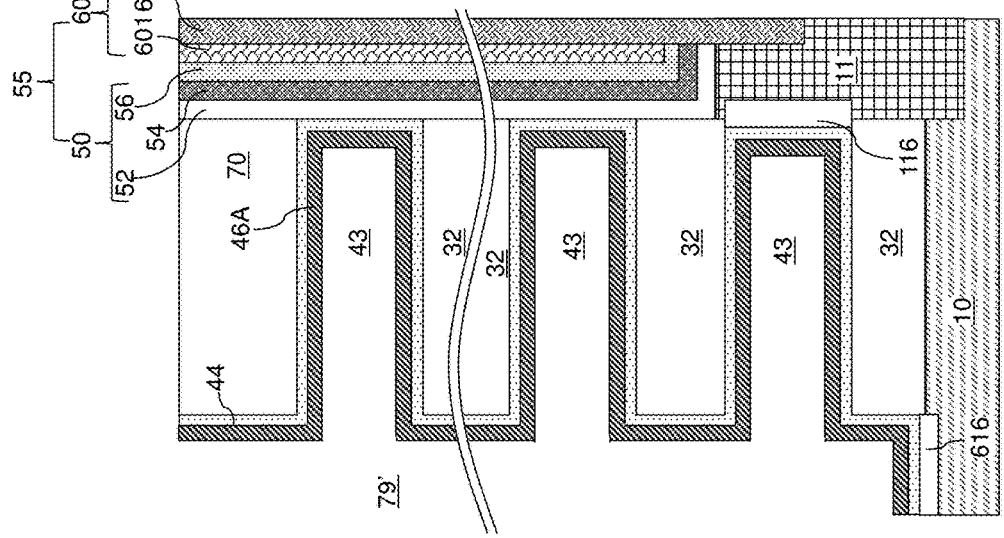

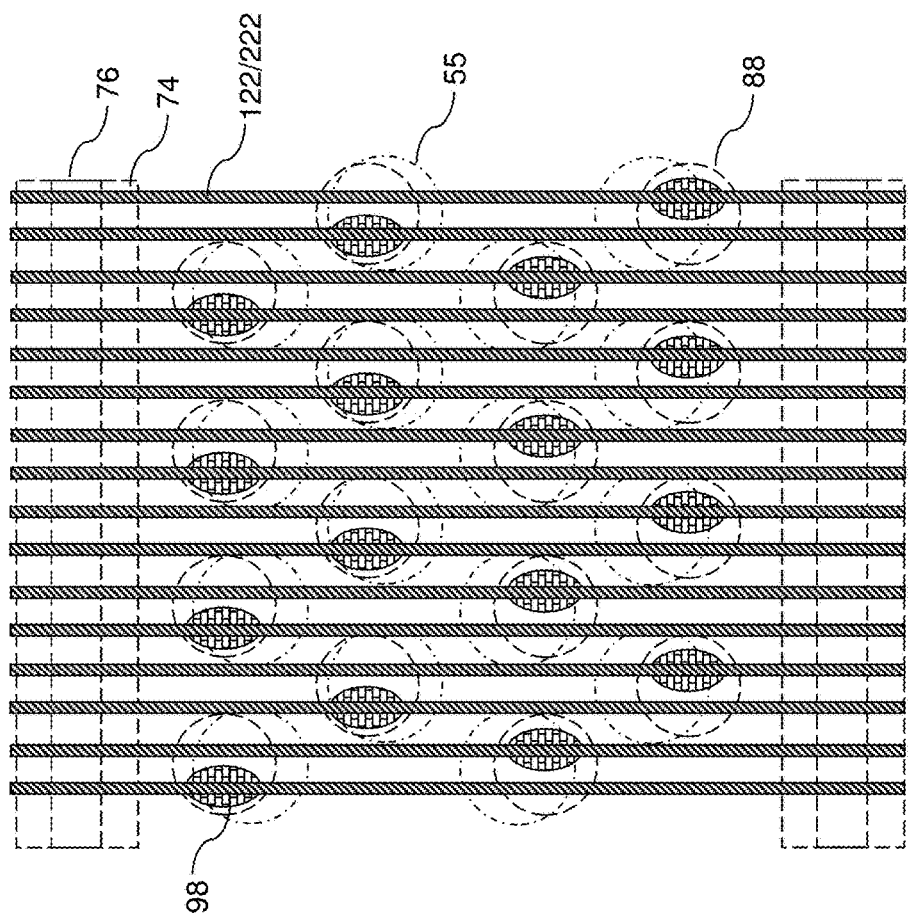

MULTIPLE LINER INTERCONNECTS FOR THREE DIMENSIONAL MEMORY DEVICES AND METHOD OF MAKING THEREOF

FIELD

The present disclosure relates generally to the field of semiconductor devices, and particular to a three-dimensional memory device containing multiple liner interconnects and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a structure comprising an electrically conductive structure embedded within at least one dielectric material layer is provided. The electrically conductive structure comprises: a metal portion consisting essentially of an elemental metal or an intermetallic alloy of at least two elemental metals; a first metallic liner comprising a first metallic material and contacting a bottom surface of the metal portion and at least lower portions of sidewalls of the metal portion; and a second metallic liner comprising a second metallic material and contacting a top surface of the metal portion. The first metallic material and the second metallic material differ in composition, and the first metallic liner and the second metallic liner contact an entirety of all surfaces of the metal portion.

According to another aspect of the present disclosure, a method of forming a structure is provided, which comprises: forming at least one dielectric material layer over a substrate; forming an opening through the at least one dielectric material layer; forming a first metallic liner on a bottom surface and sidewalls of the opening by depositing a first metallic material; forming a metal portion consisting essentially of an elemental metal or an intermetallic alloy of at least two elemental metals on the first metallic liner; and forming a second metallic liner comprising a second metallic material directly on a top surface of the metal portion. The first metallic material and the second metallic material differ in composition, and the first metallic liner and the second metallic liner contact an entirety of all surfaces of the metal portion.

BRIEF DESCRIPTION OF THE DRAWINGS

FIGS. 5A-5H are sequential schematic vertical cross-sectional views of a memory opening within the exemplary structure up to the processing step of deposition of a second semiconductor channel layer according to an embodiment of the present disclosure.

FIG. 8 is a schematic vertical cross-sectional view of the exemplary structure after formation of backside recesses according to an embodiment of the present disclosure.

FIGS. 9A-9D are sequential vertical cross-sectional views of a region of the exemplary structure during formation of electrically conductive layers according to an embodiment of the present disclosure.

FIG. 28 is a top-down view of an embodiment of the exemplary structure of the present disclosure.

DETAILED DESCRIPTION

Figure 1:
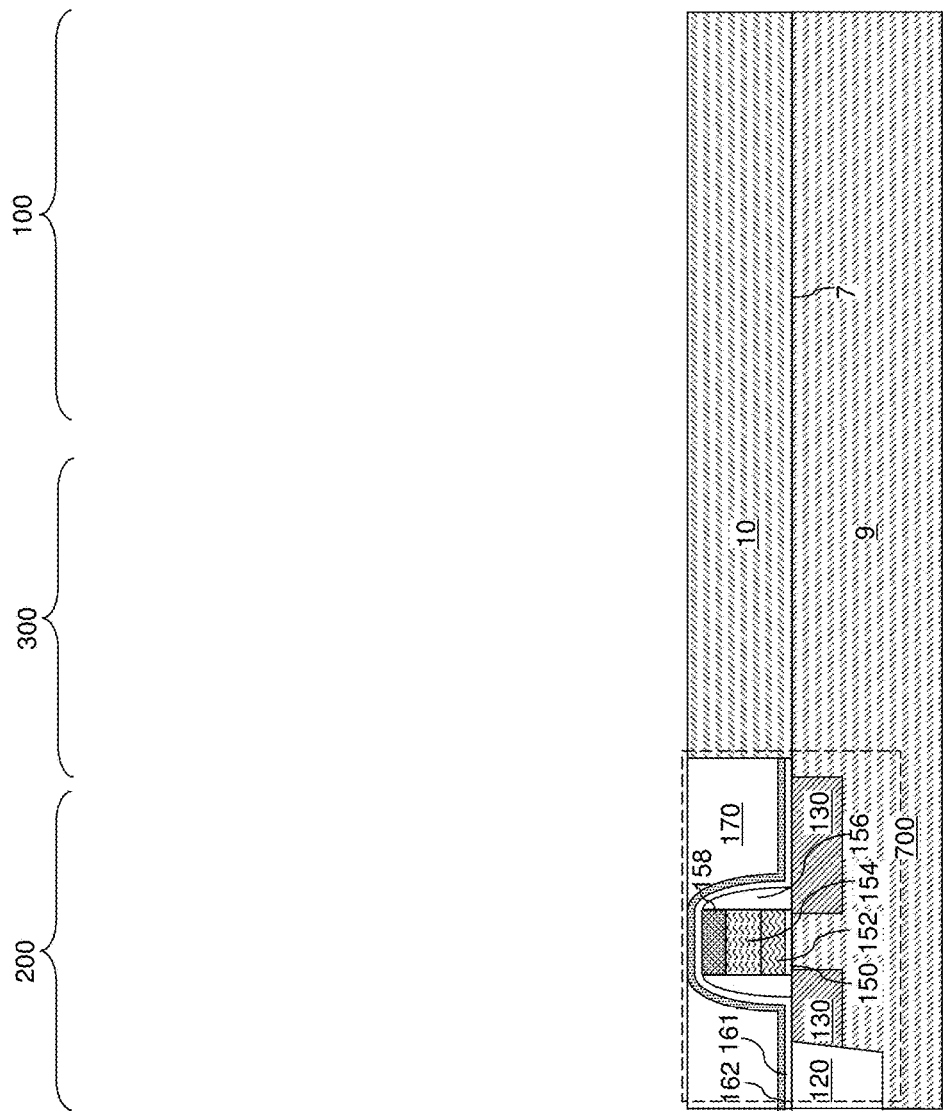
FIG. 1 is a schematic vertical cross-sectional view of an exemplary structure after formation of at least one peripheral device and a semiconductor material layer according to an embodiment of the present disclosure.

As discussed above, the present disclosure is directed to three-dimensional memory devices including a vertical stack of multilevel memory arrays and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, a gate electrode (152, 154), and a gate cap dielectric 158. The gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment, the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

Figure 2:
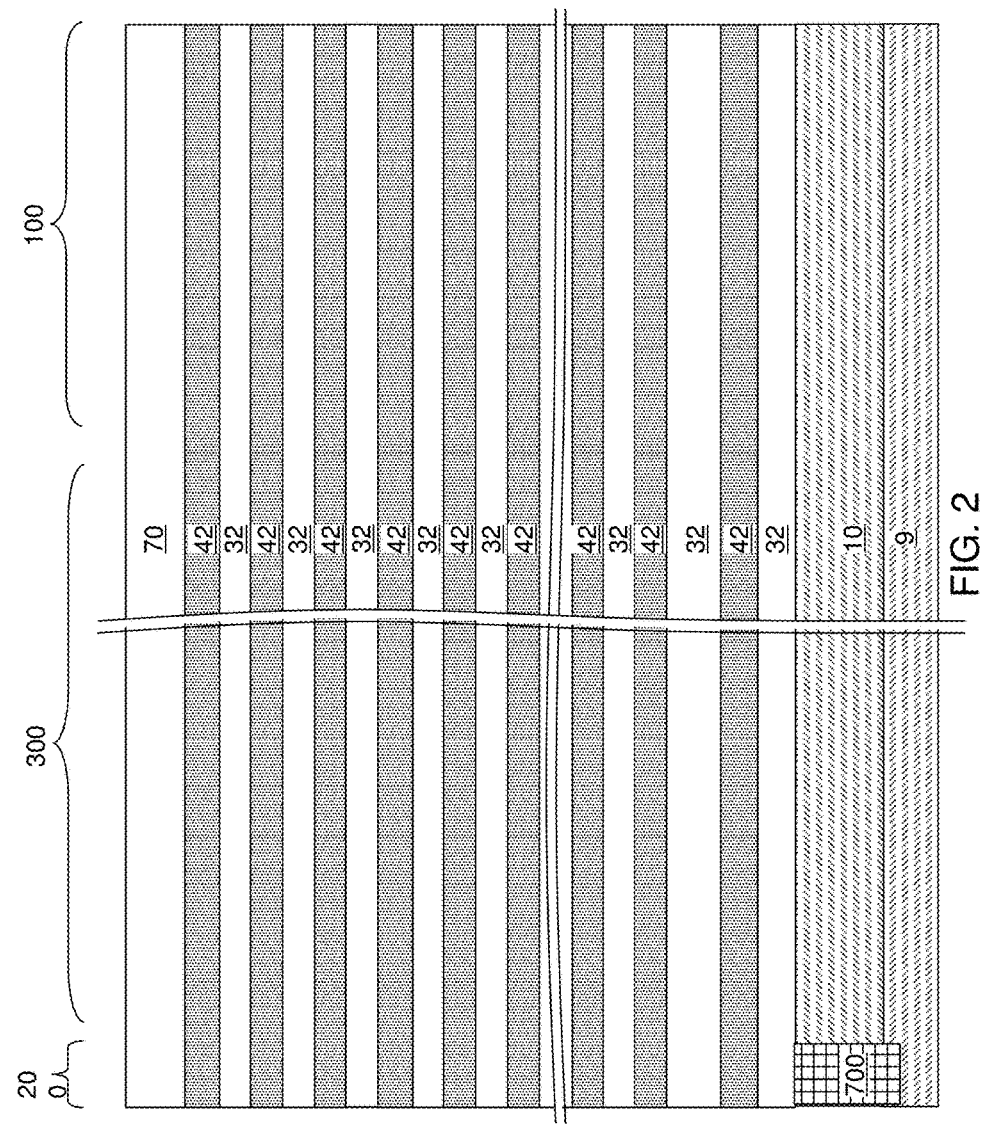
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
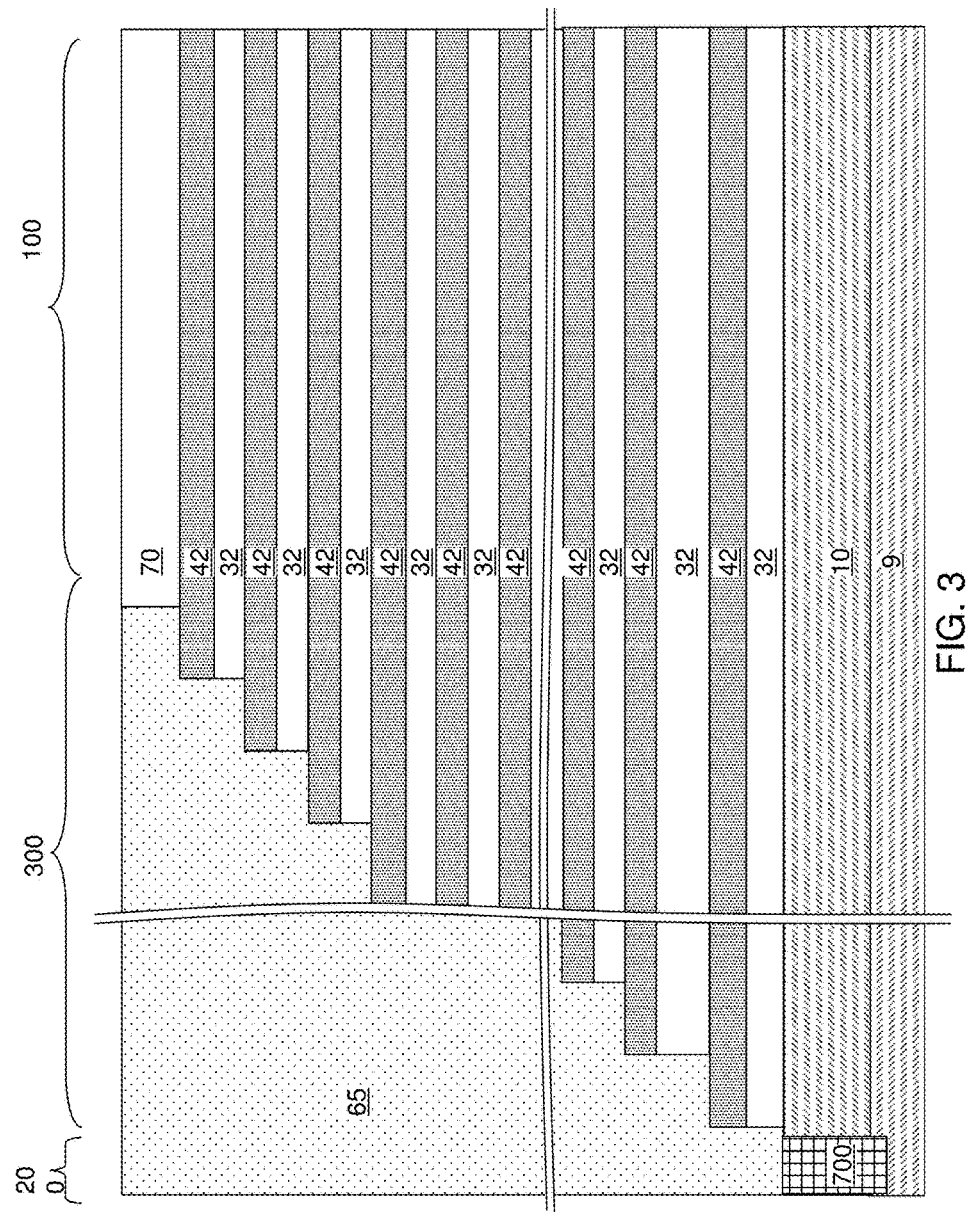
FIG. 3 is a schematic vertical cross-sectional view of the exemplary structure after formation of stepped terraces and a retro-stepped dielectric material portion according to an embodiment of the present disclosure.

Referring to FIG. 3, a stepped cavity can be formed within the contact region 300 which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

After formation of the stepped cavity, a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the alternating stack (32, 42). Each sacrificial material layer 42 other than a topmost sacrificial material layer 42 within the alternating stack (32, 42) laterally extends farther than any overlying sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
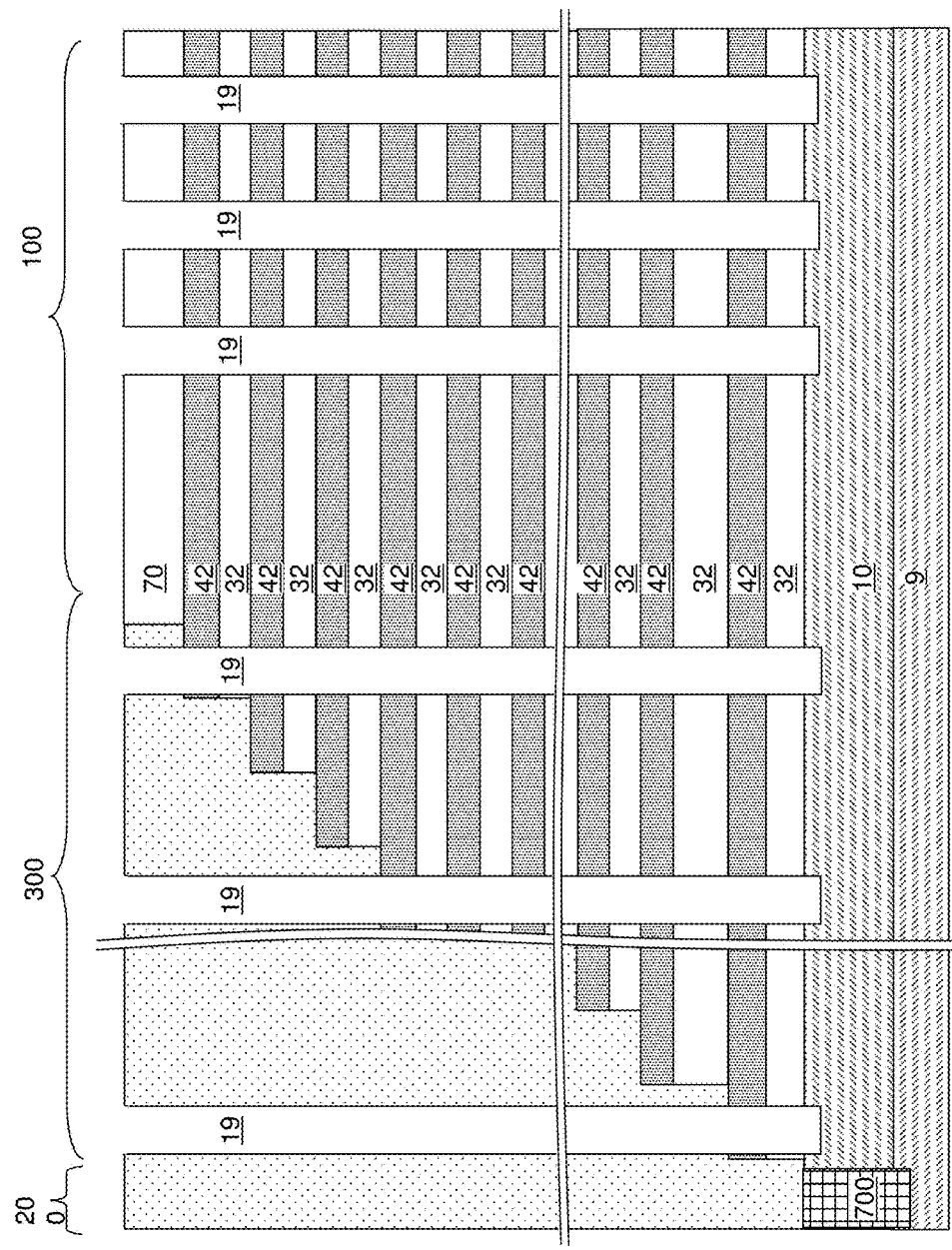
FIG. 4A is a schematic vertical cross-sectional view of the exemplary structure after formation of memory openings and support openings according to an embodiment of the present disclosure.
Figure 4B:
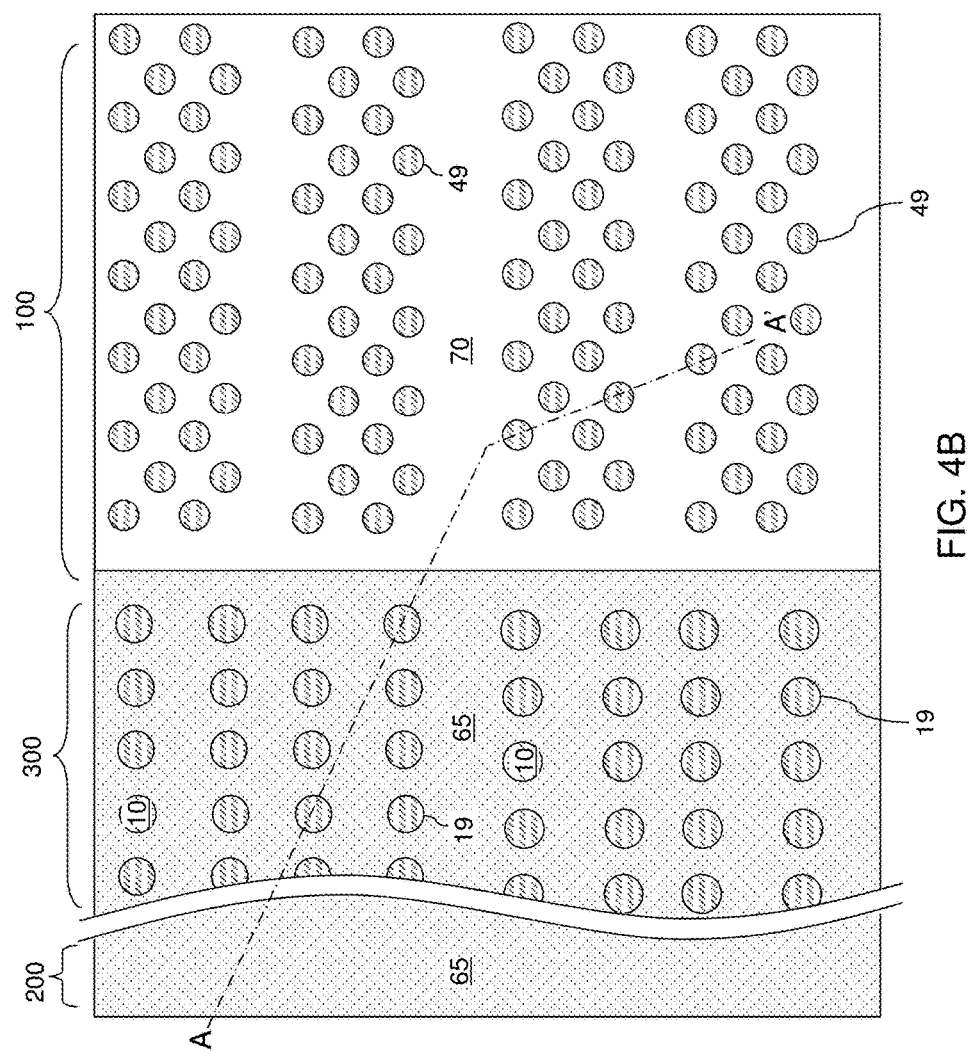
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 5C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 5D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor substrate layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 5E, a second semiconductor channel layer 602 can be deposited directly on the semiconductor surface of the pedestal channel portion 11 or the semiconductor substrate layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 5F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 5H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure (11, 55, 62, 63). Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure 20. See FIG. 6.

Figure 6:
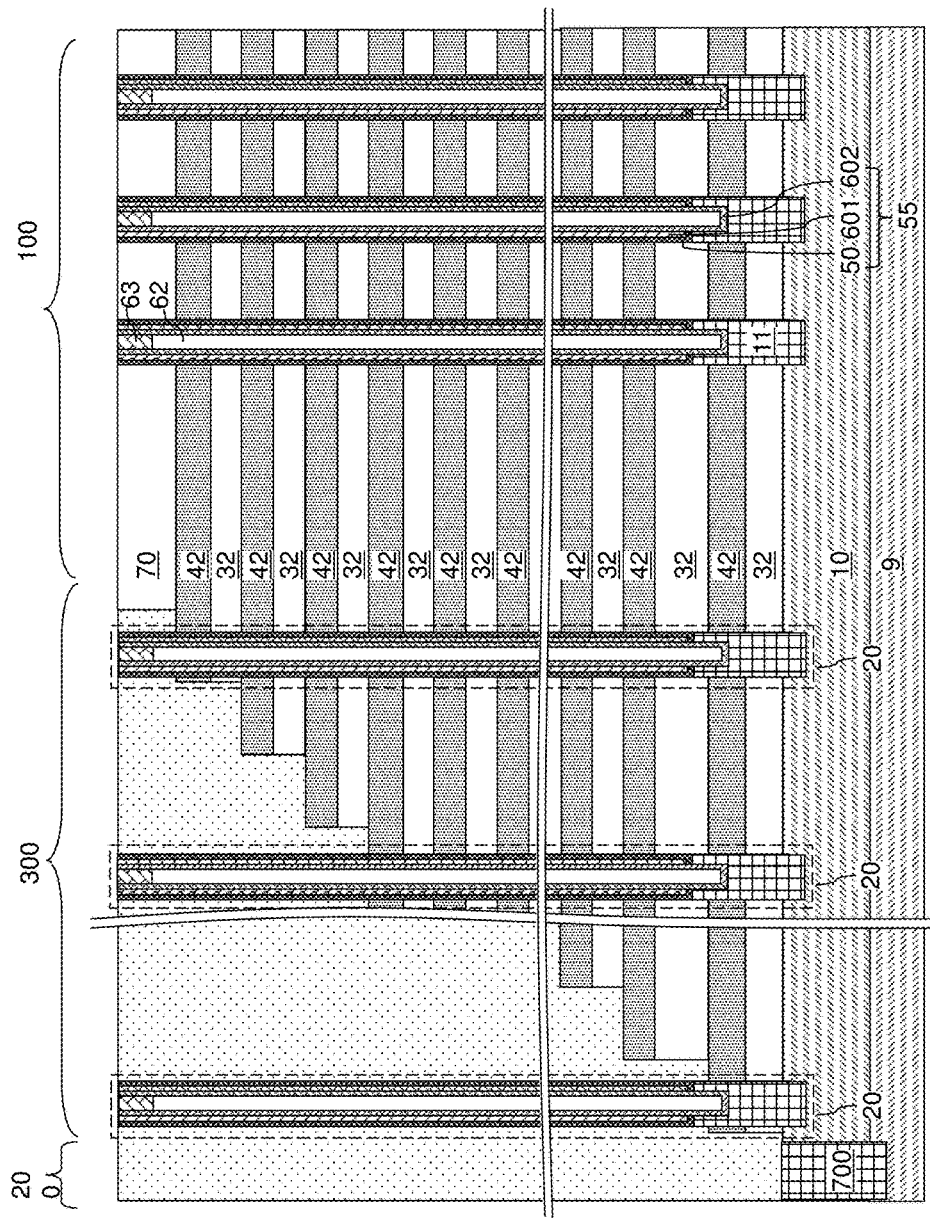
FIG. 6 is a schematic vertical cross-sectional view of the exemplary structure after formation of memory stack structures and support pillar structures according to an embodiment of the present disclosure.

Referring to FIG. 6, the exemplary structure is illustrated after formation of memory opening fill structures (11, 55, 62, 63) and support pillar structure 20 within the memory openings 49 and the support openings 19, respectively. An instance of a memory opening fill structure (11, 55, 62, 63) can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
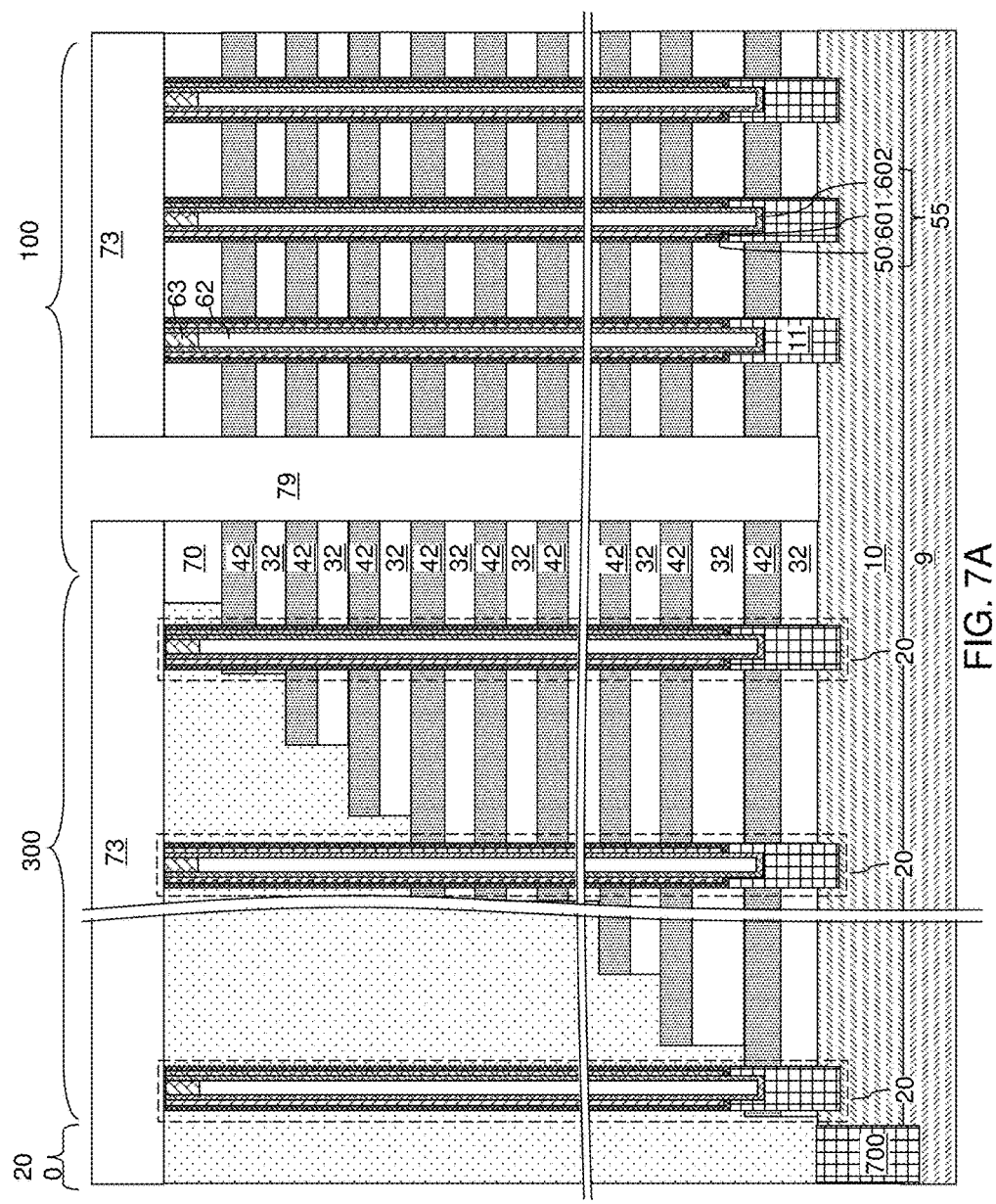
FIG. 7A is a schematic vertical cross-sectional view of the exemplary structure after formation of a backside trench according to an embodiment of the present disclosure.
Figure 7B:
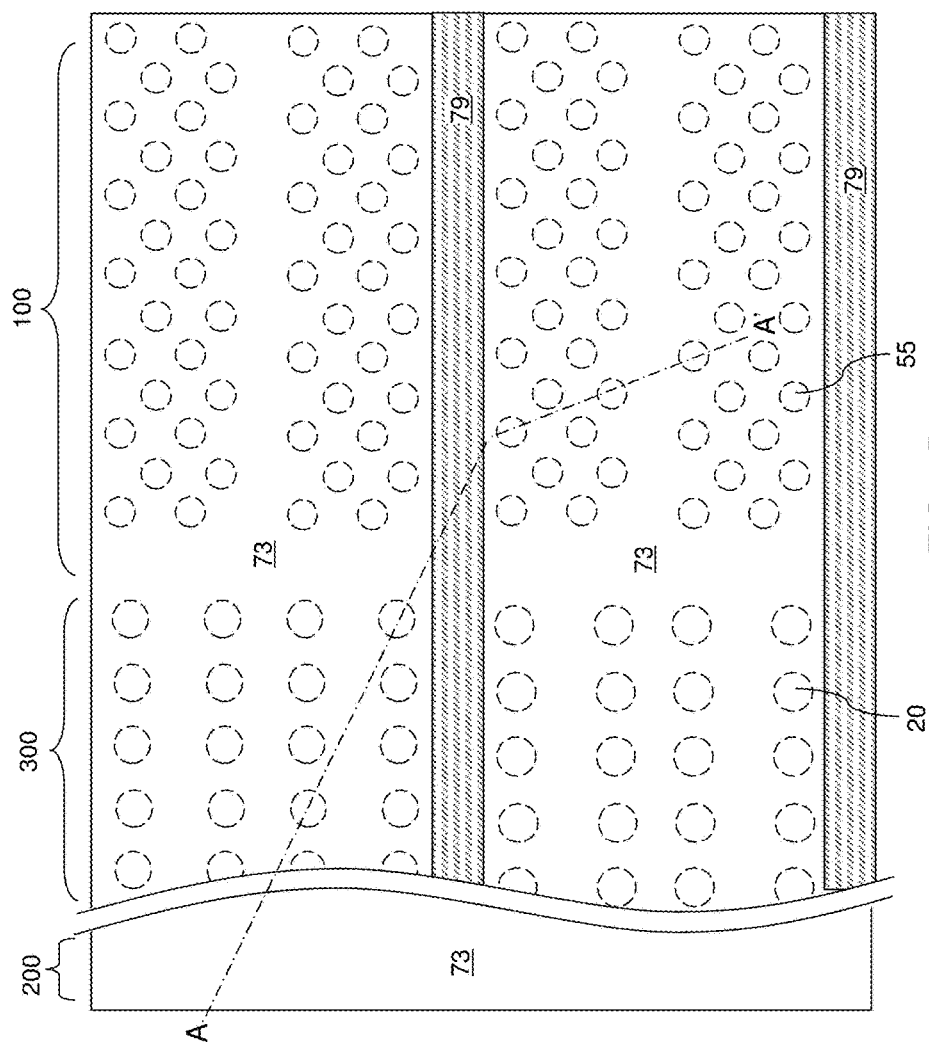
FIG. 7B is a partial see-through top-down view of the exemplary structure of FIG. 7A. The vertical plane A-A' is the plane of the schematic vertical cross-sectional view of FIG. 7A.

Referring to FIGS. 7A and 7B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the contact region 300. In one embodiment, the backside trenches 79 can include a source contact opening in which a source contact via structure can be subsequently formed. The photoresist layer can be removed, for example, by ashing.

Referring to FIGS. 8 and 9A, an etchant that selectively etches the second material of the sacrificial material layers 42 with respect to the first material of the insulating layers 32 can be introduced into the backside trenches 79, for example, employing an etch process. FIG. 9A illustrates a region of the exemplary structure of FIG. 8. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 9B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 9C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Figure 10:
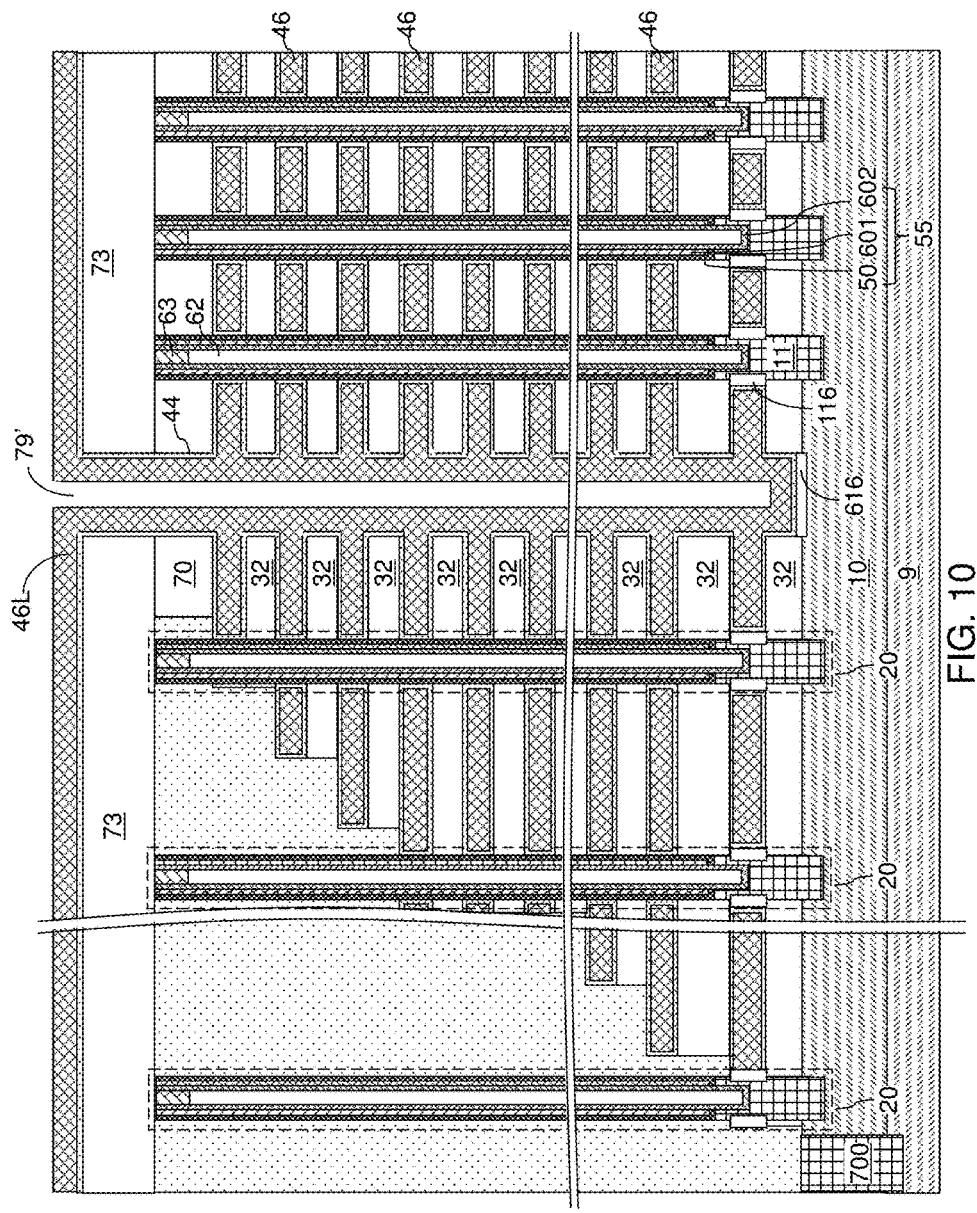
FIG. 10 is a schematic vertical cross-sectional view of the exemplary structure at the processing step of FIG. 9D.

Referring to FIGS. 9D and 10, a metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the contact level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 11:
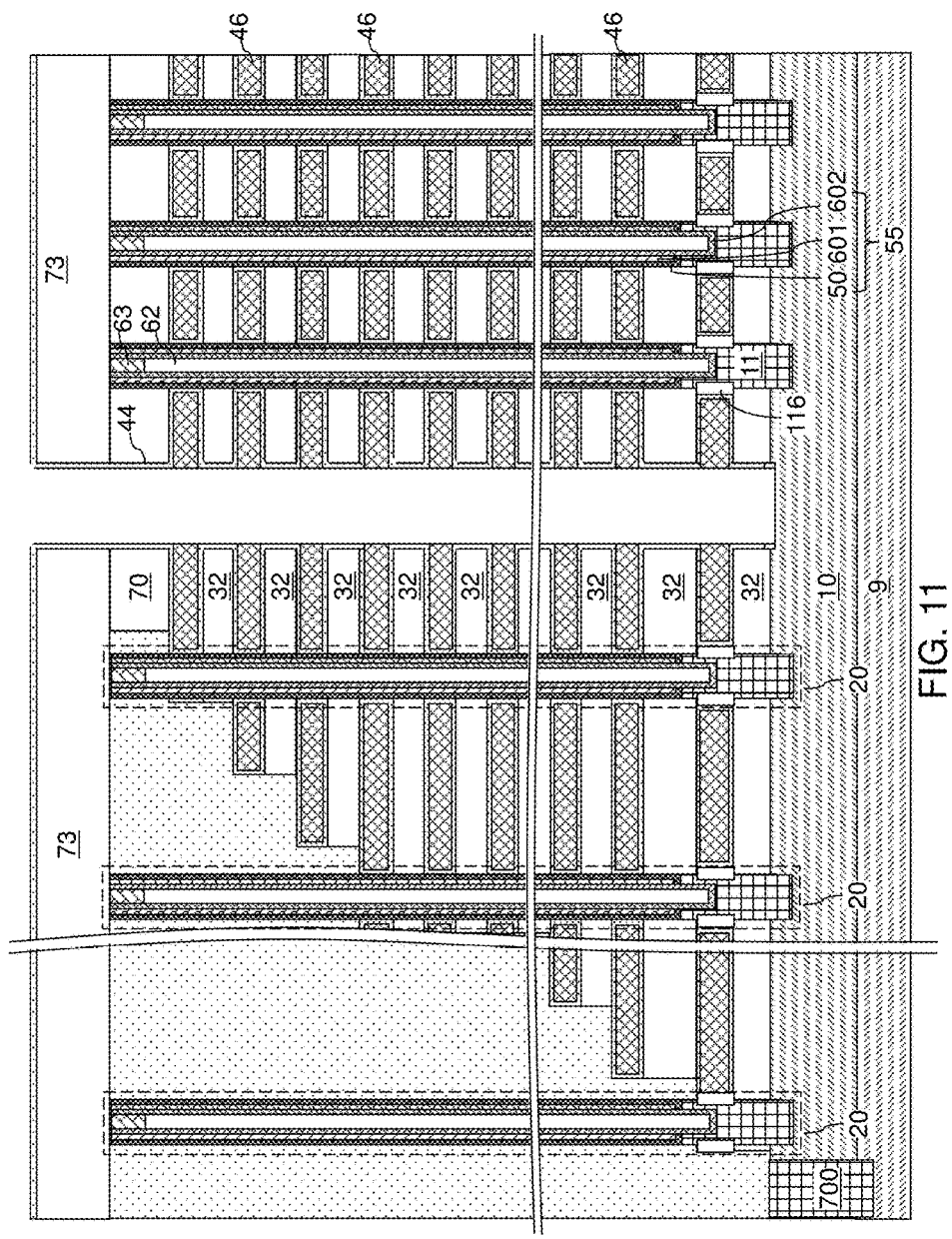
FIG. 11 is a schematic vertical cross-sectional view of the exemplary structure after removal of a deposited conductive material from within the backside trench according to an embodiment of the present disclosure.

Referring to FIG. 11, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79.

Figure 12A:
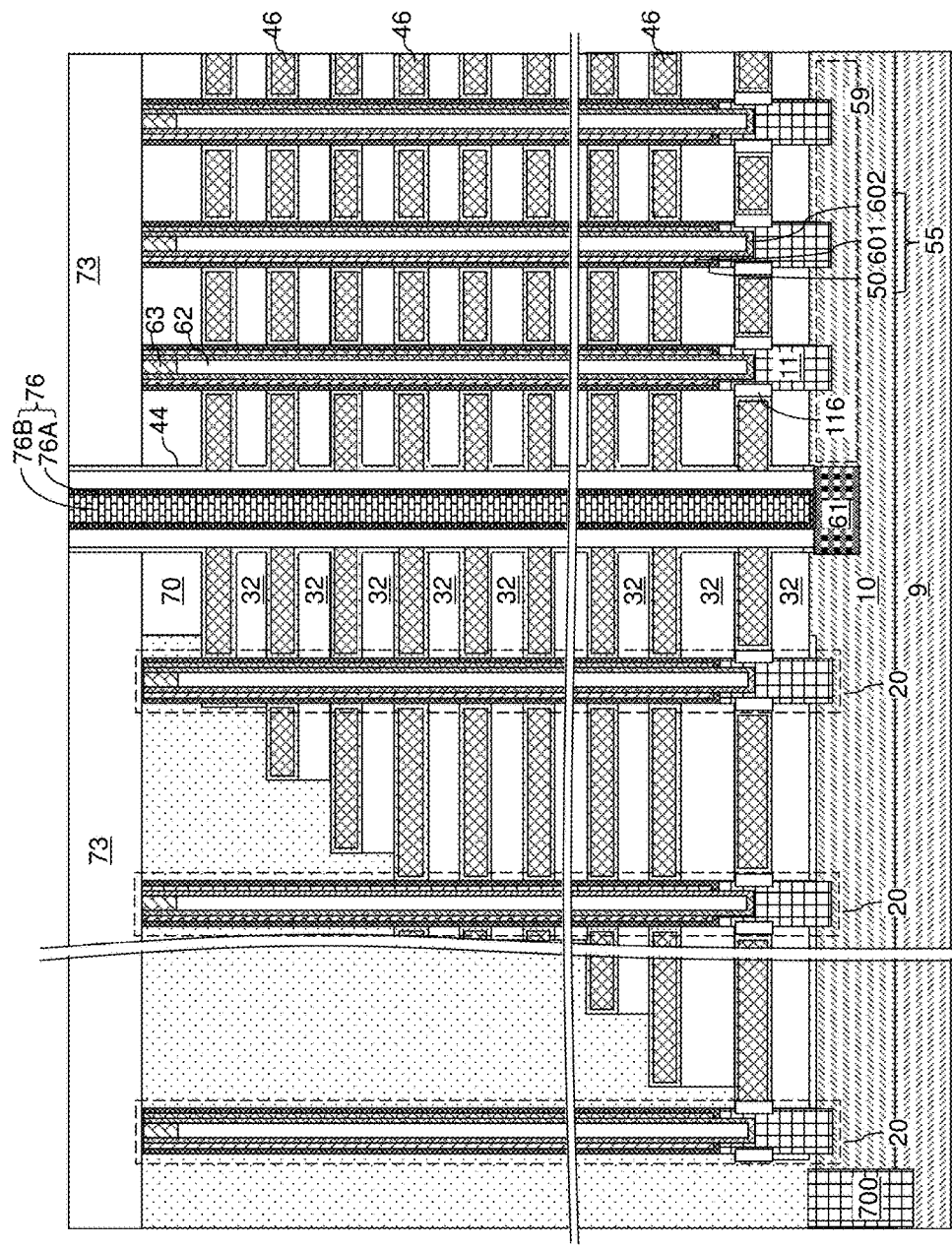
FIG. 12A is a schematic vertical cross-sectional view of the exemplary structure after formation of an insulating spacer and a backside contact structure according to an embodiment of the present disclosure.
Figure 12B:
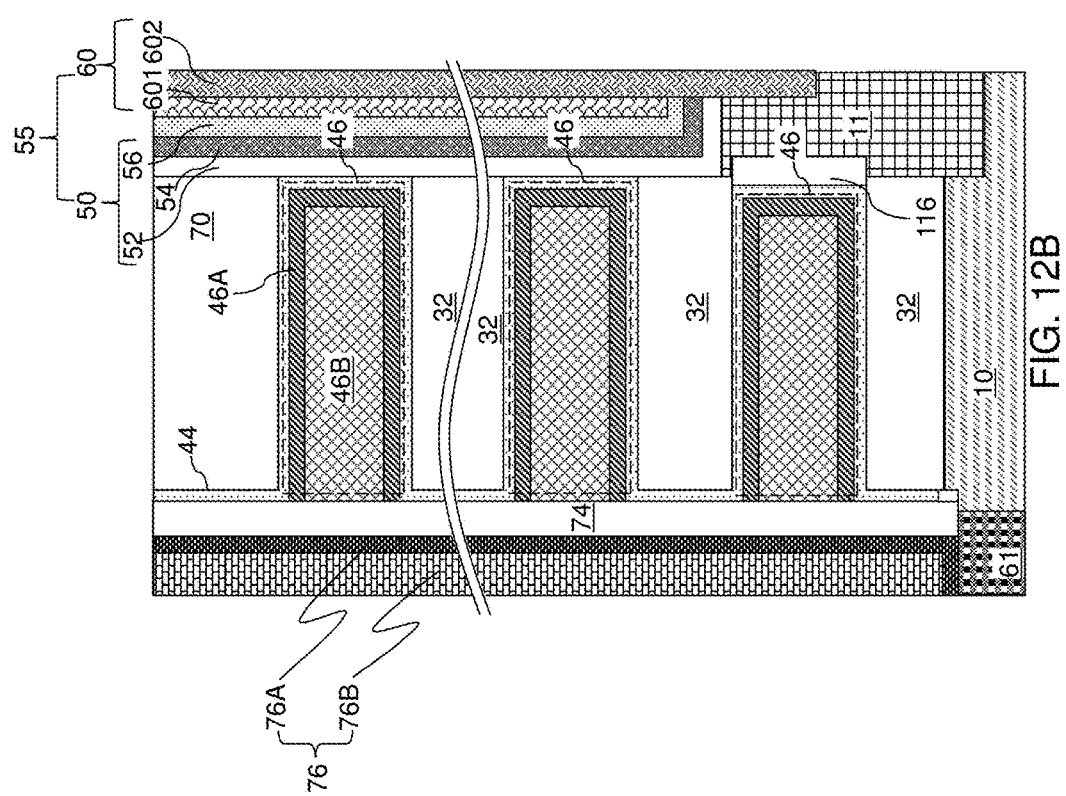
FIG. 12B is a magnified view of a region of the exemplary structure of FIG. 12A.

Referring to FIGS. 12A and 12B, an insulating material layer can be formed in the at least one backside trench 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Figure 13A:
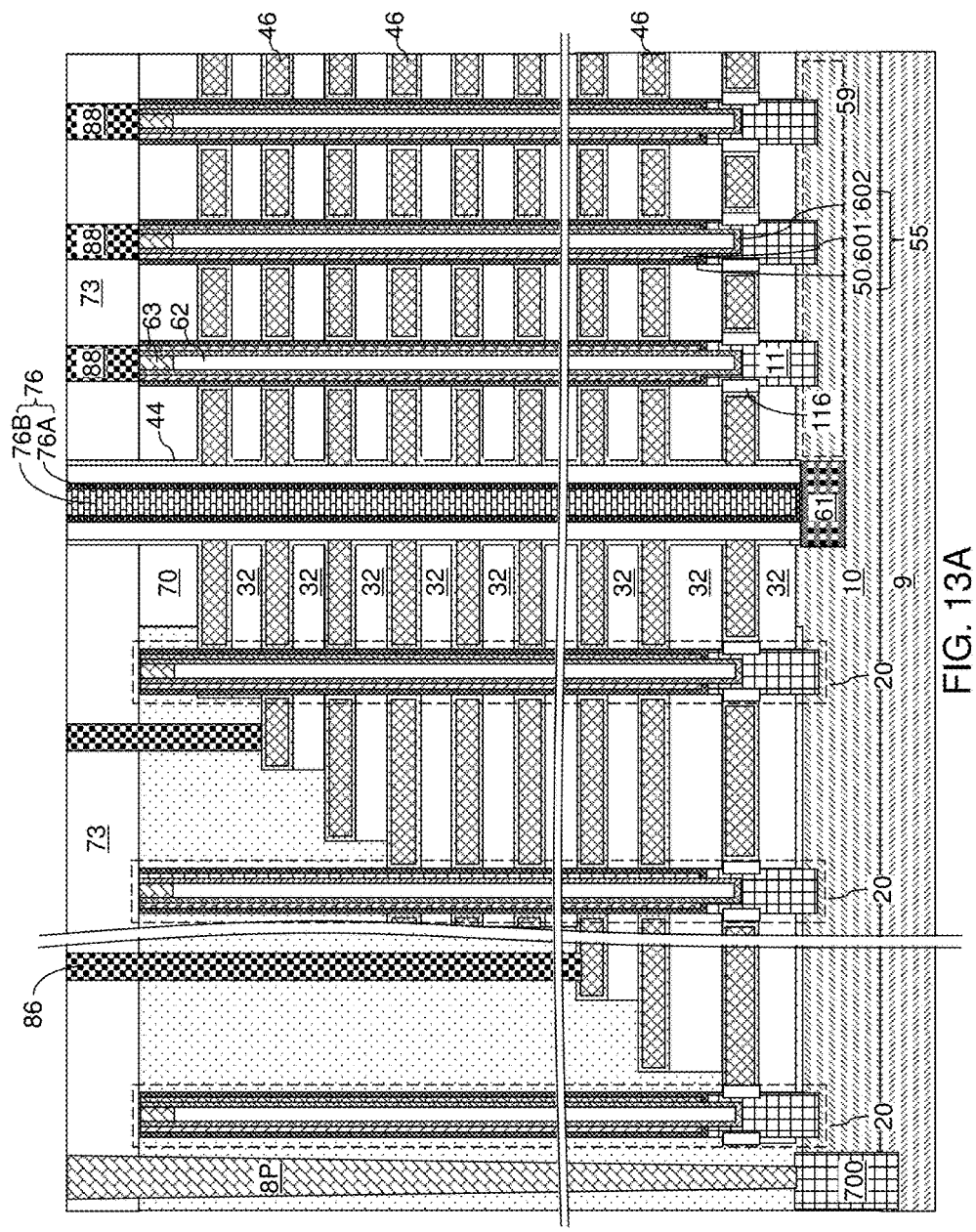
FIG. 13A is a schematic vertical cross-sectional view of the exemplary structure after formation of additional contact via structures according to an embodiment of the present disclosure.
Figure 13B:
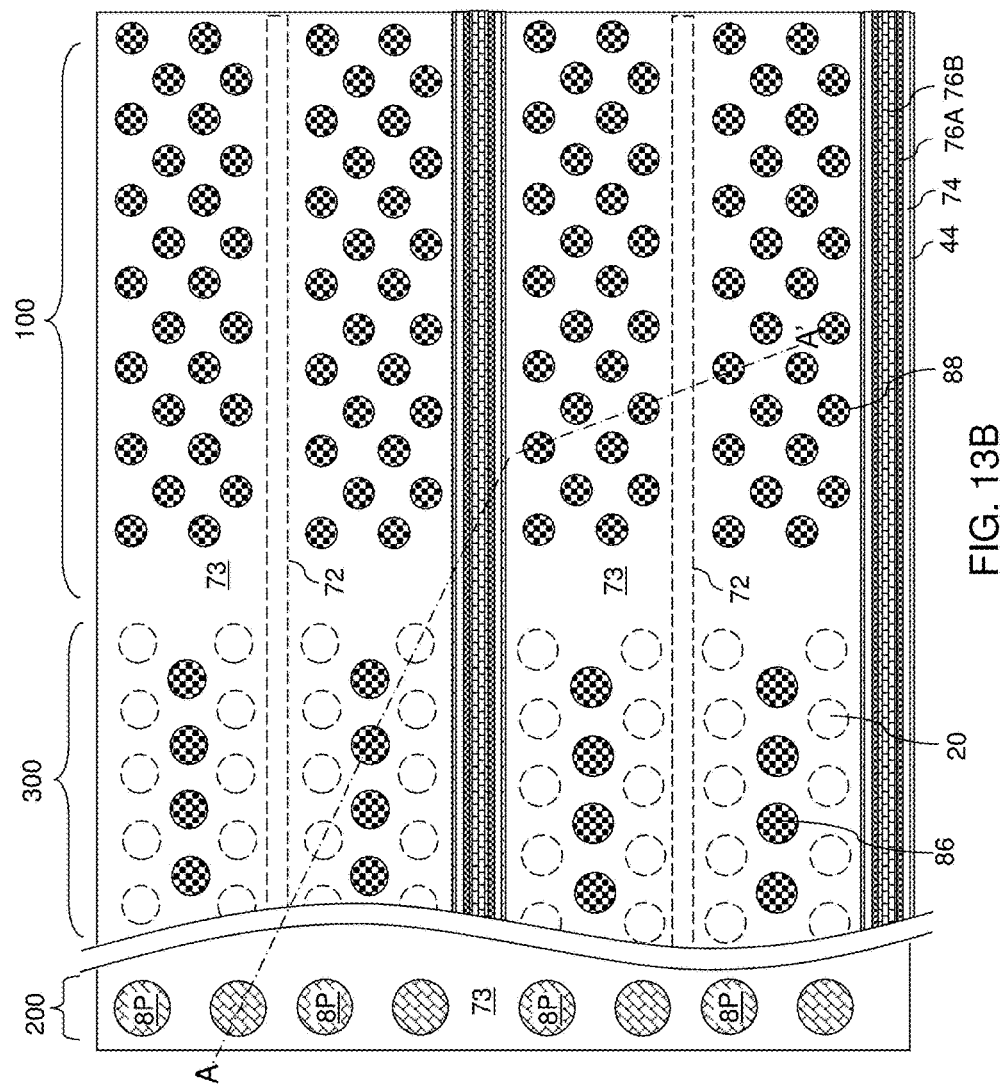
FIG. 13B is a top-down view of the exemplary structure of FIG. 13A. The vertical plane A-A' is the plane of the schematic vertical cross-sectional view of FIG. 13A.

Referring to FIGS. 13A and 13B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

Figure 14:
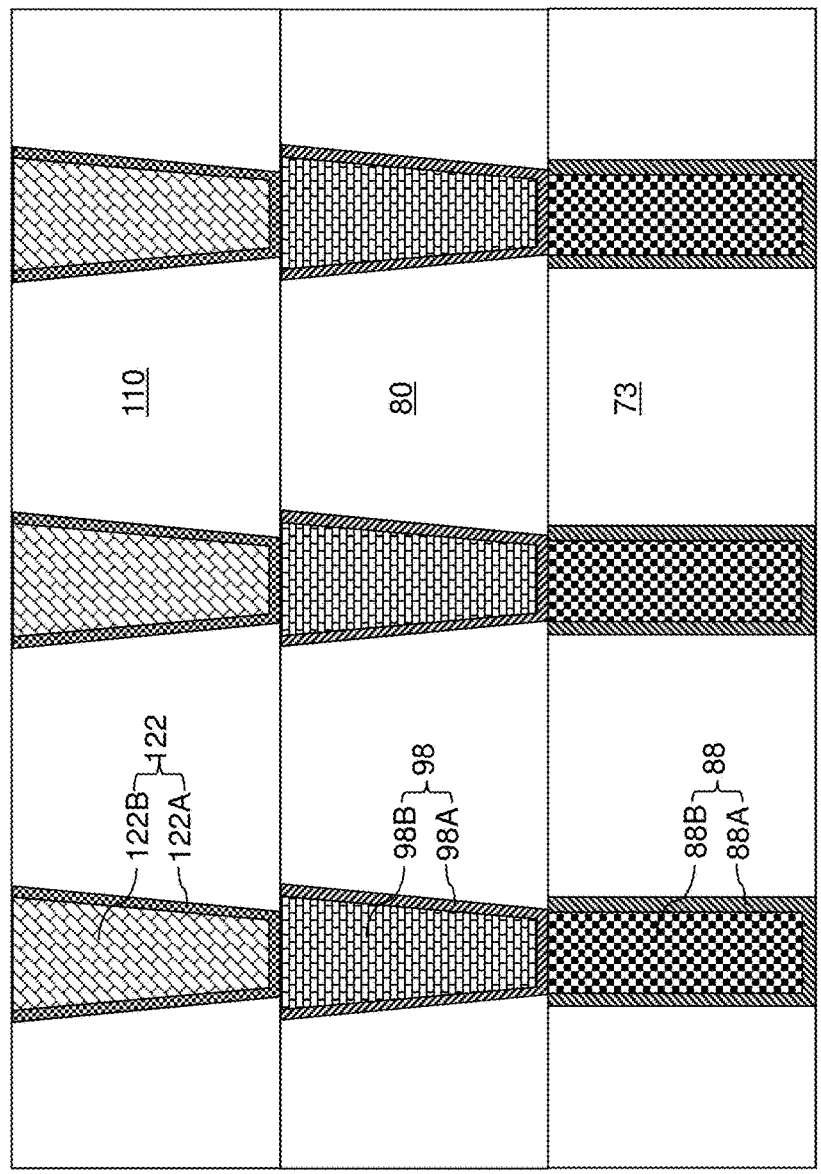
FIG. 14 is a vertical cross-sectional view of a first configuration of the exemplary structure after formation of intermediate level metal electrically conductive structures, a first dielectric material layer, first metallic liners, and metal portions according to a first embodiment of the present disclosure.

Referring to FIG. 14, a first configuration of an interconnect region of the exemplary structure is illustrated. The drain contact via structures 88 embedded within the contact level dielectric layer 73 are illustrated in detail. Each of the drain contact via structures 88 can include a drain contact metallic liner 88A and a drain contact metal fill portion 88B embedded within the drain contact metallic liner 88A. The drain contact metallic liner 88A can include a conductive metal nitride material, such as TiN, TaN, or WN, and the drain contact metal fill portion 88B can include a metal, such as copper, tungsten or alloy thereof.

An optional intermediate level dielectric layer 80 can be formed over the contact level dielectric layer 73. The intermediate level dielectric layer 80 can include a dielectric material such as silicon oxide or organosilicate glass, and can optionally incorporate a dielectric cap material layer such as nitrogen-doped organosilicate glass, silicon nitride, or silicon oxynitride. The thickness of the intermediate level dielectric layer 80 can be in a range from 50 nm to 600 nm, such as from 100 nm to 300 nm, although lesser and greater thicknesses can also be employed.

Optional intermediate level metal electrically conductive structures 98 can be formed in the intermediate level dielectric layer 80. The intermediate level metal electrically conductive structures 98 can include conductive via structures that provide vertically conductive paths (e.g., vertical electrical connections) and/or conductive line structures that provide laterally conductive paths in addition to vertical electrical connections to underlying conductive structures (such as the drain contact via structures 88) and/or overlying conductive structures to be subsequently formed. Each of the intermediate level metal electrically conductive structures 98 can include an interconnect level metallic liner 98A and an interconnect level metal fill portion 98B embedded within the interconnect level metallic liner 98A. The interconnect level metallic liner 98A can include a conductive metal nitride material, such as TiN, TaN, or WN, and the interconnect level metal fill portion 98B can include a metal, such as copper, tungsten or alloy thereof.

At least one dielectric material layer can be subsequently formed over the intermediate level dielectric layer 80. In one embodiment, the at least one dielectric material layer can include a first dielectric material layer 110, such as silicon nitride, silicon oxide or organosilicate glass. In one embodiment, the first dielectric material layer 110 is a low-k dielectric material layer having a dielectric constant less than 3.9 such as organosilicate glass or fluorosilicate glass. In one embodiment, the first dielectric material layer 110 can include doped silicate glass (such as fluorosilicate glass) or undoped silicate glass.

Openings are formed through the first dielectric material layer 110, for example, by applying and patterning a photoresist layer over the first dielectric material layer 110 to form openings therein, and by transferring the pattern in the photoresist layer through the first dielectric material layer 110 by an anisotropic etch process. A top surface of an intermediate level metal electrically conductive structures 98 can be physically exposed at the bottom of each opening in the first dielectric material layer 110. The sidewalls of the openings can be vertical or tapered.

A first metallic liner layer including a first metallic material can be deposited as a continuous material layer on the bottom surfaces and sidewalls of the openings and over the top surface of the first dielectric material layer 110. In one embodiment, the first metallic liner layer includes a material selected from a conductive metallic nitride and an elemental transition metal. For example, the first metallic material can include a conductive metal nitride material such as TiN, TaN, or WN, and/or a metal such as Ti, Ta, W or Co, and/or a metal alloy such as cobalt-tungsten ("CoW") or cobalt-tungsten-phosphorus ("CoWP") alloy. The first metallic material can be deposited by a conformal deposition method such as chemical vapor deposition (CVD), or plating (e.g., electroplating or electroless plating), or by a non-conformal deposition method such as physical vapor deposition (PVD). The thickness of the sidewall portions of the first metallic material liner layer can be in a range from 1 nm to 35 nm, such as from 3 nm to 10 nm, although lesser and greater thicknesses can also be employed.

A metal layer is deposited in the unfilled volumes of the openings and over the first metallic liner layer. The metal layer can include an elemental metal such as copper or tungsten, an intermetallic alloy including copper, or an intermetallic alloy including tungsten. The volumes of the openings can be completely filled with the first metallic liner layer and the metal layer. In one embodiment, the first metallic liner layer can include, or consist essentially of, titanium, and the metal layer can include, or consist essentially of, copper.

A planarization process such as chemical mechanical planarization (CMP) process can be performed to remove portions of the first metallic liner layer and the metal layer that overlie the horizontal plane including the top surface of the first dielectric material layer 110. Each remaining portion of the first metallic liner layer constitutes a first metallic liner 122A. Each remaining portion of the metal layer constitutes a metal portion 122B. Each adjoining set of a first metallic liner 122A and a metal portion 122B constitutes a metal electrically conductive structure 122, which can be a line structure (such as a bit line of the three-dimensional memory device described above) or a via structure.

Figure 15:
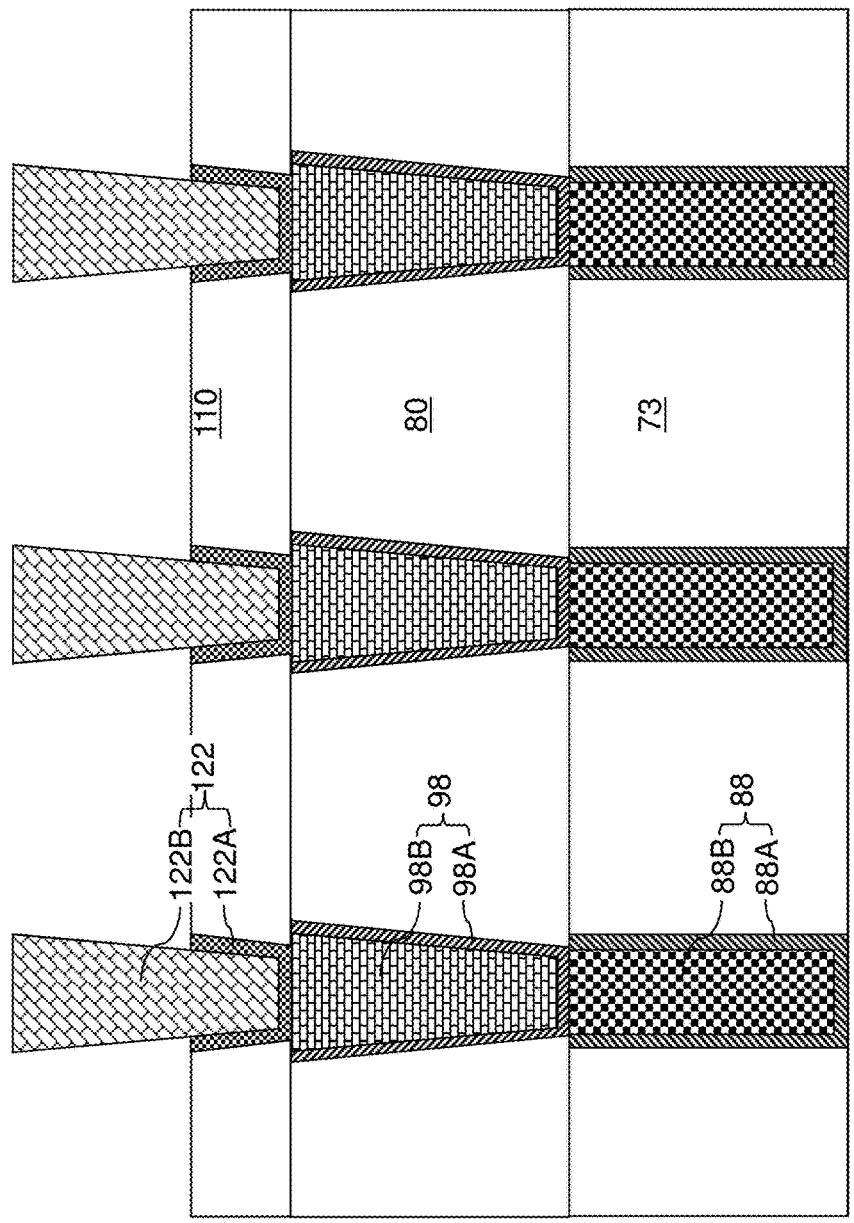
FIG. 15 is a vertical cross-sectional view of the first configuration of the exemplary structure after recessing the first dielectric material layer according to the first embodiment of the present disclosure.

Referring to FIG. 15, the first dielectric material layer 110 (or a topmost dielectric material layer in case a plurality of dielectric material layers is employed) can be vertically recessed by a selective etch process, which may be an isotropic etch process or an anisotropic etch process. For example, chemical dry etching (CDE) process can be employed to recess the first dielectric material layer 110. In one embodiment, the chemistry of the etch process can be selected such that the etch process collaterally removes physically exposed portions of the first metallic liners 122A while removing the dielectric material of the first dielectric material layer 110. The chemistry of the etch process can be selective to the metal portions 122B. For example, if the first dielectric material layer 110 includes silicon oxide or nitride, the first metallic liners 122A include titanium, and the metal portions 122B include copper, the isotropic etch can remove the physically exposed portions of the first metallic liners 122A without removing the metal portions 122B. The top surfaces and upper portions of the sidewalls of each metal portion 122B can be physically exposed after the anisotropic etch. The remaining portion of each first metallic liner 122A can be embedded within the remaining portions of the first dielectric material layer 110.

Figure 16:
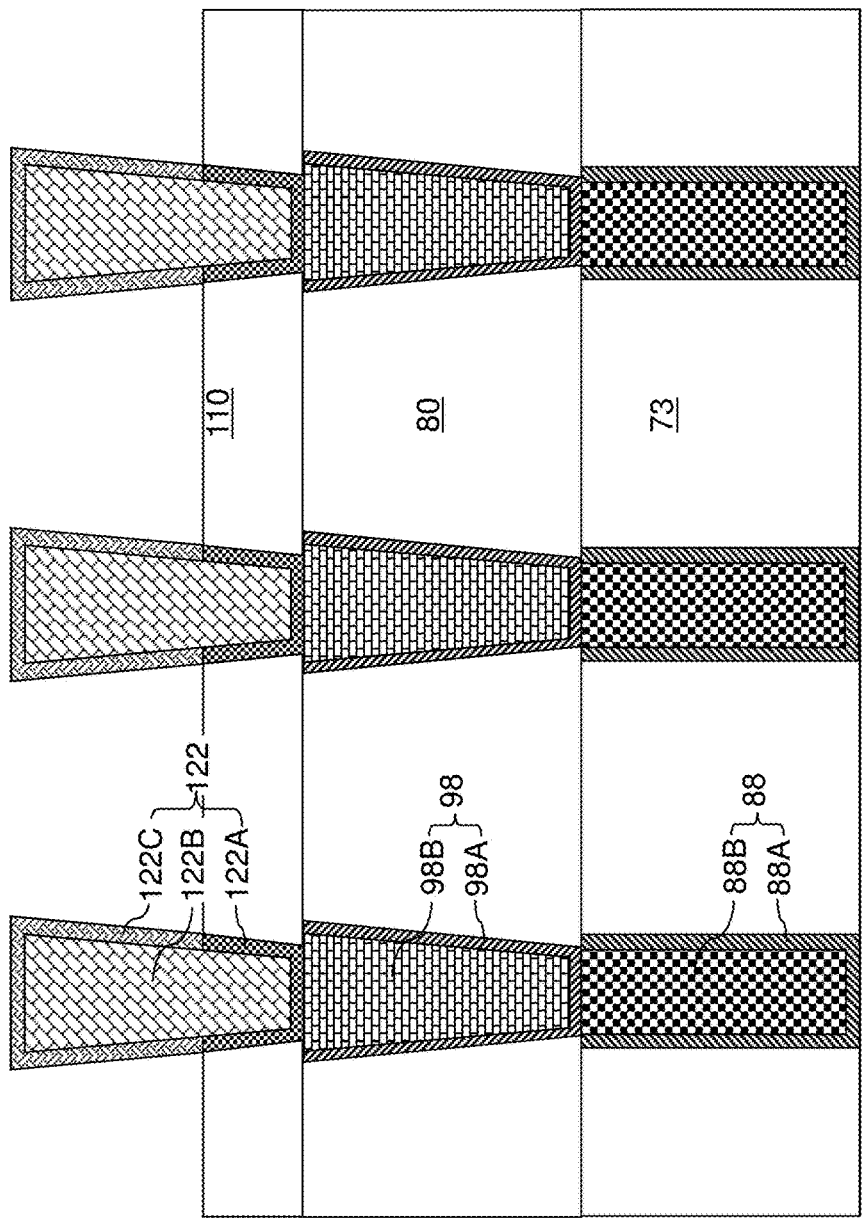
FIG. 16 is a vertical cross-sectional view of the first configuration of the exemplary structure after formation of second metallic liners according to the first embodiment of the present disclosure.

Referring to FIG. 16, a surface cleaning process can be optionally performed to remove surface metal oxide from the physically exposed surfaces of the metal portions 122B. For example, if the metal portions 122B include copper, native copper oxide on the surfaces of the metal portions 122B can be removed by a NH$_3$ plasma cleaning process. The reaction chemistry can be:

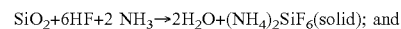

$SiO_2 + 6HF + 2\ NH_3 \rightarrow 2H_2O + (NH_4)_2SiF_6(\text{solid})$; and

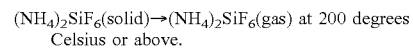

$(NH_4)_2SiF_6(\text{solid}) \rightarrow (NH_4)_2SiF_6(\text{gas})$ at 200 degrees Celsius or above.

The temperature of the exemplary structure can be maintained in a range from 200 degrees Celsius to 300 degrees Celsius to provide effective surface metal oxide cleaning, while reducing or preventing migration of copper.

A second metallic liner 122C can be deposited by a selective metal deposition process on the physically exposed metallic surfaces of the metal portions 122B. In one embodiment, the selective metal deposition process can include a selective chemical vapor metal deposition process. In one embodiment, the second metallic liner 122C can be formed by a selective aluminum chemical vapor deposition process. Dimethyl aluminum hydride can be employed as the aluminum precursor for the deposition process. In this case, the reaction chemistry for selective deposition of aluminum can be:

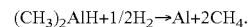

$(CH_3)_2AlH + 1/2 H_2 \rightarrow Al + 2CH_4$.

Decomposition of dimethyl aluminum hydride occurs only on metallic surfaces, such as the copper surfaces of the metal portions 122B, and does not proceed on dielectric surfaces of the first dielectric material layer 110. Physically exposed copper surfaces of the metal portions 122B can be covered with a respective second metallic liner 122L, which can consist essentially of aluminum. Each second metallic liner 122C is formed on upper portions of the sidewalls of a respective metal portion 122B and the top surface of the respective metal portion 122B as a single continuous layer or structure. The thickness of the second metallic liner 122C can be in a range from 1 nm to 30 nm, such as from 3 nm to 10 nm, although lesser and greater thicknesses can also be employed. Alternatively, another barrier material, such as cobalt, CoW or CoWP can be used instead of aluminum and can be deposited by another method, such as plating.

The first metallic material of the first metallic liners 122A and the second metallic material of the second metallic liners 122C can differ in composition. For each metal portion 122B, a first metallic liner 122A and a second metallic liner 122C can contact an entirety of all surfaces of the metal portion 122B. Each second metallic liner 122C can be incorporated into a respective one of the metal electrically conductive structures 122. Thus, each metal electrically conductive structure 122 can include a first metallic liner 122A, a metal portion 122B, and a second metallic liner 122C, as shown in FIG. 16.

Figure 17:
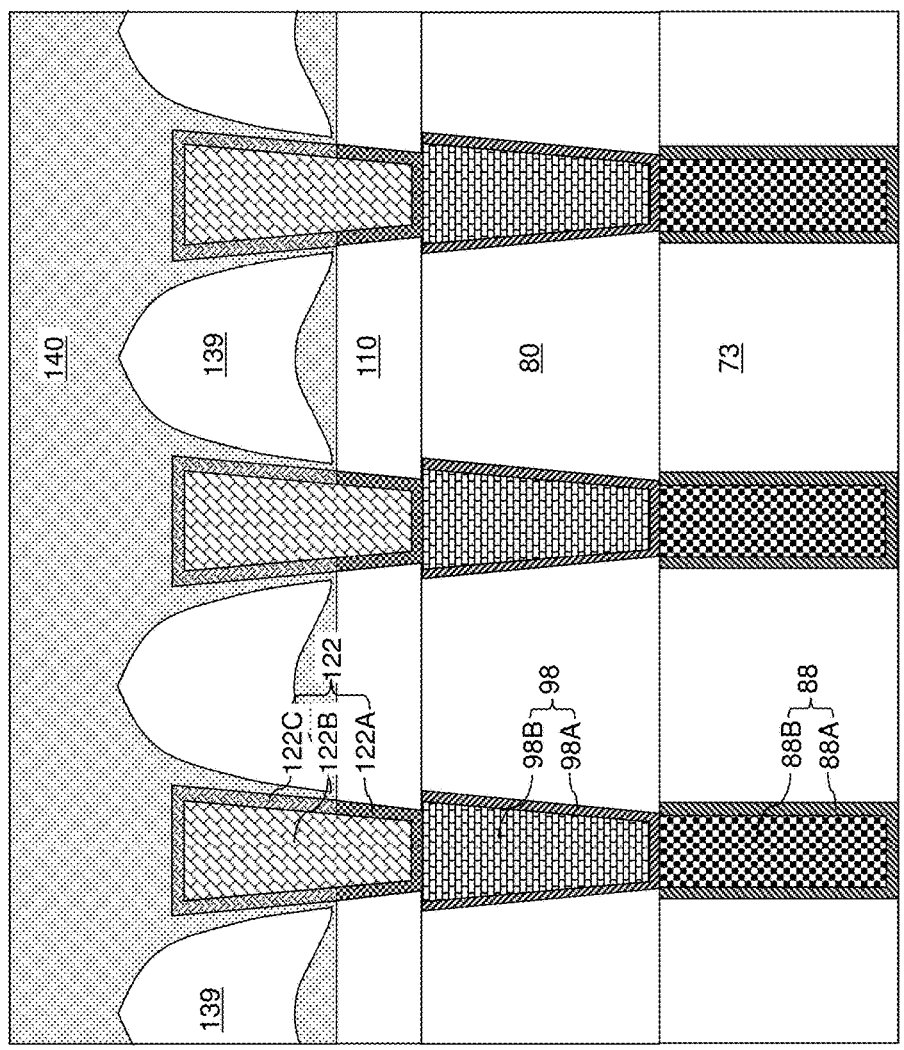
FIG. 17 is a vertical cross-sectional view of the first configuration of the exemplary structure after formation of an air-gap dielectric layer according to the first embodiment of the present disclosure.

Referring to FIG. 17, an additional dielectric material layer can be deposited on the metal electrically conductive structures 122 and over the first dielectric material layer 110. The additional dielectric material layer is herein referred to as a second dielectric material layer 140.

In one embodiment, the second dielectric material layer 140 includes an air-gap dielectric layer. As used herein, an "air-gap dielectric layer" refers to a dielectric material layer including at least one cavity that is under vacuum or filled with a gas-phase material. The gas-phase material may be at atmospheric pressure or may be a reduced pressure. In this case, the second dielectric material layer 140 can include at least one cavity (e.g., air gap) 139 filled with vacuum or a gas phase material. The air-gap dielectric layer which comprises the second dielectric material layer 140 can be formed by anisotropic deposition of a dielectric material with highly anisotropic deposition characteristics. In one embodiment, the second dielectric material layer 140 can be deposited by plasma enhanced chemical vapor deposition (PECVD).

For example, a depletive deposition process in which deposition of the dielectric material occurs at a high rate on vertically protruding horizontal surfaces and at a low rate at recessed horizontal surfaces or sidewall surfaces. In this case, preferential accumulation of the dielectric material from the top surfaces of the metal electrically conductive structures 122 induce lateral expansion of discrete deposited portions of the dielectric material and subsequent merging, thereby inducing formation of the at least one cavity 139 underneath the merged portions of the dielectric material. Optionally, portions of the dielectric material can be deposited on the top surface of the first dielectric material layer 110 and on the sidewalls of the second metallic liners 122C provide bottom surfaces and sidewall surfaces that define the extent of the at least one cavity 139.

In one embodiment, the dielectric material of the air-gap dielectric layer, which comprises the second dielectric material layer 140, surrounds each of the at least one cavity 139, physically contacts each of the second metallic liners 122C, and does not physically contact the first metallic liners 122A. The first dielectric material layer 110 laterally surrounds the first metallic liners 122A, and the second dielectric material layer 140 laterally surrounds the second metallic liner 122C. The second dielectric material layer 140 can include the same material as, or can include a different material from, the first dielectric material layer 110. In one embodiment, the second dielectric material layer 140 can include a material having a different dielectric constant different from the first dielectric material layer 110. In an illustrative example, the first dielectric material layer 110 can include doped or undoped silicate glass (i.e., silicon oxide) or organosilicate glass, and the second dielectric material layer can include silicon nitride or silicon carbonitride ("SiCN") or a hydrogen-containing and/or porous derivative thereof. The at least one cavity 139 may be formed as a plurality of discrete cavities or as a single cavity that laterally surrounds each of the metal electrically conductive structures 122. In one embodiment, the at least one cavity 139 can provide above the horizontal plane including the top surfaces of the metal electrically conductive structures 122 at multiple locations.

The first configuration of the exemplary structure can include an electrically conductive structure 122 embedded within at least one dielectric material layer (110, 140), wherein the electrically conductive structure 122 comprises: a metal portion 122B consisting essentially of an elemental metal or an intermetallic alloy of at least two elemental metals; a first metallic liner 122A comprising a first electrically conductive (e.g., metallic) material and contacting a bottom surface of the metal portion 122B and at least lower portions of sidewalls of the metal portion 122B; and a second metallic liner 122C comprising a second electrically conductive (e.g., metallic) material and contacting a top surface of the metal portion 122B. The first metallic material and the second metallic material differ in composition, and the first metallic liner 122A and the second metallic liner 122C contact an entirety of all surfaces of the metal portion 122B. The second metallic liner 122C can contact upper portions of the sidewalls of the metal portion 122B. In one embodiment, the second metallic liner 122C consists essentially of aluminum. Alternatively, the second metallic liner 122C may consist essentially of Co, CoW or CoWP.

Figure 18:
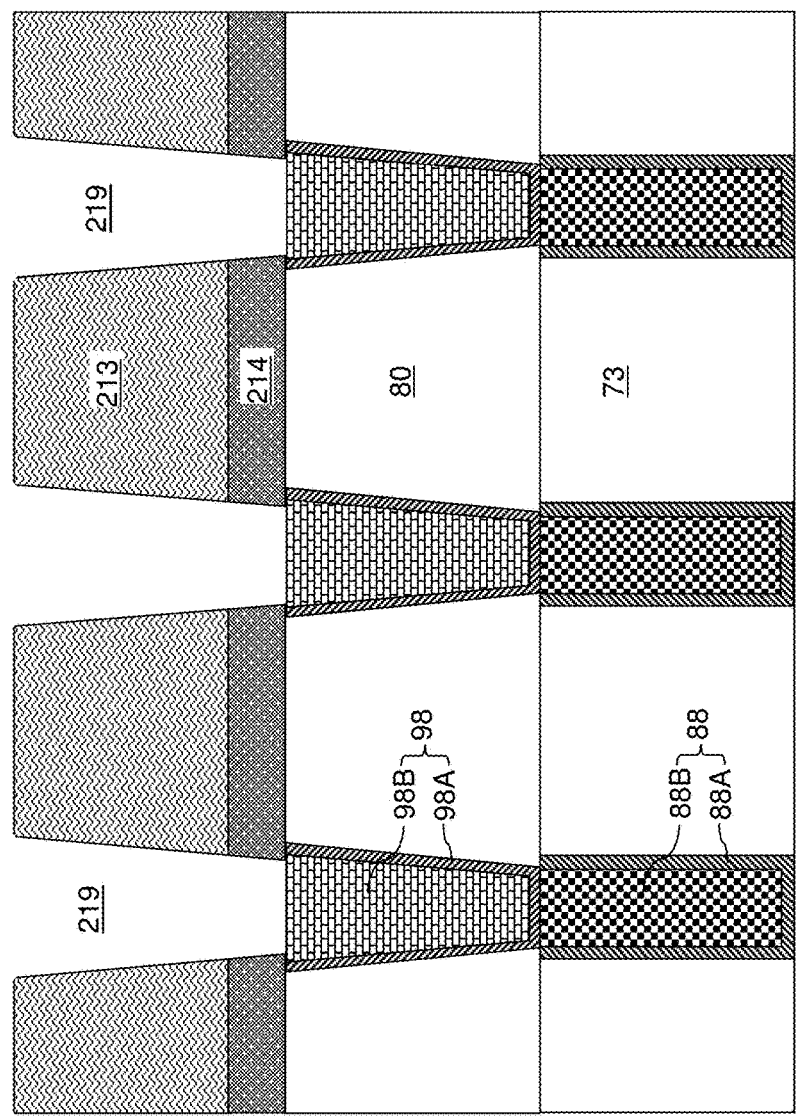
FIG. 18 is a vertical cross-sectional view of a second configuration of the exemplary structure after formation of intermediate level metal electrically conductive structures, a first dielectric material layer, a sacrificial material layer, and contact openings according to a second embodiment of the present disclosure.

Referring to FIG. 18, a second configuration of the exemplary structure can be derived from the first configuration of the exemplary structure by forming a combination of a first dielectric material layer 214 and a template material layer 213 in lieu of the first dielectric material layer 110 of the first configuration. The first dielectric material layer 214 can include silicon nitride, doped or undoped silicate glass, or a dielectric metal oxide. The first dielectric material layer 214 can be deposited by a conformal or non-conformal deposition process, and can have a thickness in a range from 3 nm to 300 nm, such as from 6 nm to 100 nm, although lesser and greater thicknesses can also be employed. The template material layer 213 can be deposited by a conformal or non-conformal deposition process, and can have a thickness in a range from 100 nm to 600 nm, such as from 150 nm to 400 nm, although lesser and greater thicknesses can also be employed.

In one embodiment, the template material layer 213 is a dielectric material which can include silicon oxide, organosilicate glass, or a porous derivative thereof. In another embodiment, the template material layer 213 includes a sacrificial material other than a dielectric material that can be subsequently removed selective to the materials of the first dielectric material layer 214 and the metal electrically conductive structures to be subsequently formed. Thus, in general, the template material layer 213 can include, for example, porous or non-porous organosilicate glass, a semiconductor material such as amorphous silicon, polysilicon, or a silicon-germanium alloy, amorphous carbon or diamond-like carbon (DLC), a silicon-based polymer material, or a combination thereof.

Openings 219 are formed through the template material layer 213 and the first dielectric material layer 214, for example, by application and patterning of a photoresist layer over the template material layer 213, and transfer of the pattern in the photoresist layer through the template material layer 213 and the first dielectric material layer 214 by an anisotropic etch process. A top surface of an intermediate level metal electrically conductive structures 98 can be physically exposed at the bottom of each opening in the template material layer 213 and the first dielectric material layer 214. The sidewalls of the openings can be vertical or tapered.

Figure 19:
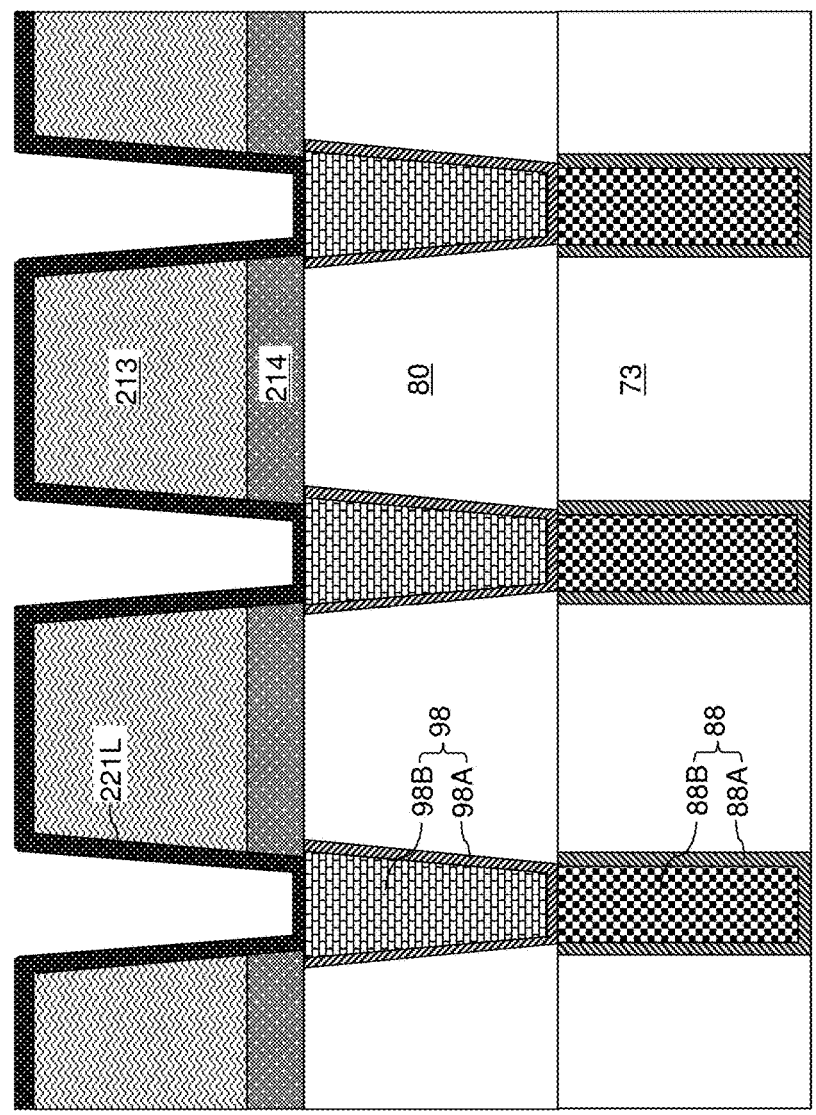
FIG. 19 is a vertical cross-sectional view of the second configuration of the exemplary structure after formation of a first continuous metallic liner layer according to the second embodiment of the present disclosure.

Referring to FIG. 19, a first metallic liner layer 221L including a first metallic material can be deposited as a continuous material layer on the bottom surfaces and sidewalls of the openings and over the top surface of the template material layer 213. The first metallic liner layer includes 221L can have the same composition and/or the same thickness as the first metallic liner layer of the first configuration described above.

Figure 20:
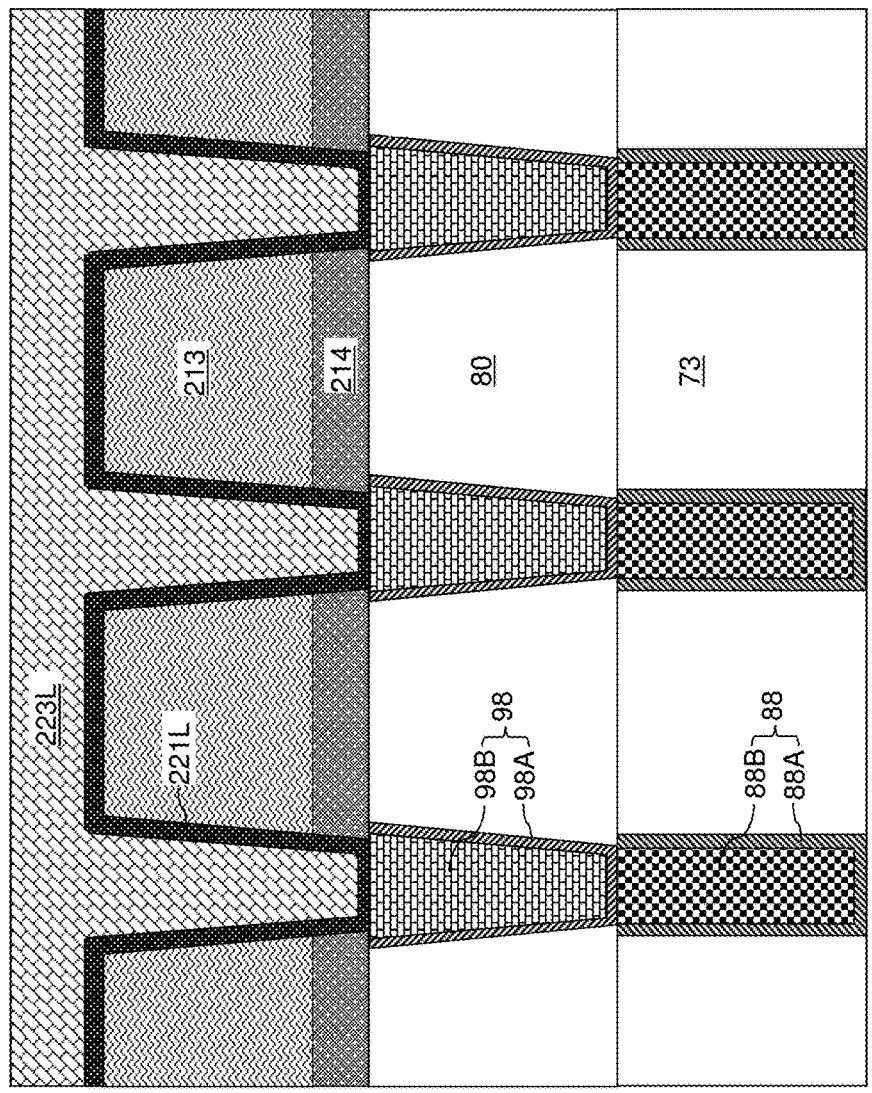
FIG. 20 is a vertical cross-sectional view of the second configuration of the exemplary structure after formation of a continuous metal layer according to the second embodiment of the present disclosure.

Referring to FIG. 20, a metal layer 223L is deposited in the unfilled volumes of the openings and over the first metallic liner layer 221L. The metal layer 223L can include an elemental metal such as copper or tungsten, an intermetallic alloy including copper, or an intermetallic alloy including tungsten. The volumes of the openings can be completely filled with the first metallic liner layer 221L and the metal layer 223L. In one embodiment, the first metallic liner layer 221L can include, or consist essentially of, titanium, and the metal layer can include, or consist essentially of, copper.

Figure 21:
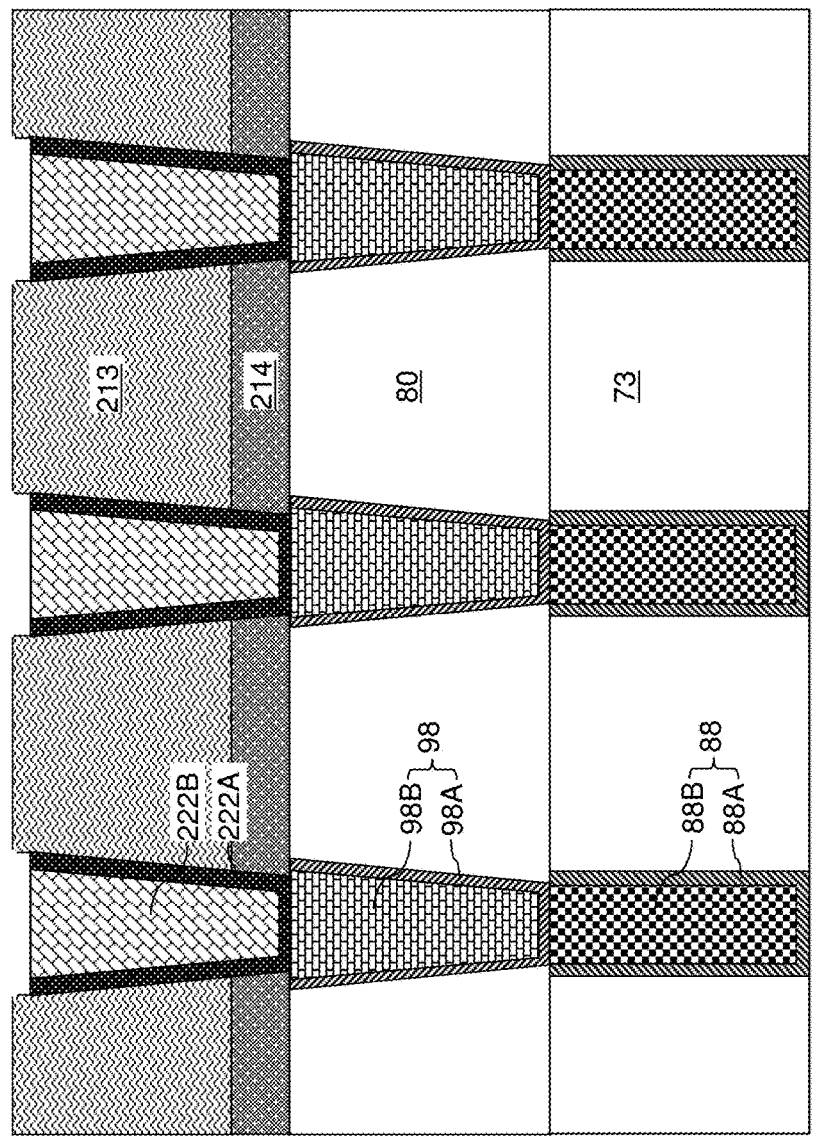
FIG. 21 is a vertical cross-sectional view of the second configuration of the exemplary structure after formation of metal portions and first metallic liners according to the second embodiment of the present disclosure.

Referring to FIG. 21, a planarization process such as chemical mechanical planarization (CMP) process can be performed to remove portions of the first metallic liner layer 221L and the metal layer 223L that overlie the horizontal plane including the top surface of the template material layer 213. Each remaining portion of the first metallic liner layer constitutes a first metallic liner 222A. Each remaining portion of the metal layer constitutes a metal portion 222B. Each adjoining set of a first metallic liner 222A and a metal portion 222B constitutes a metal electrically conductive structure 222, which can be a line structure or a via structure.

The top surfaces of the metal electrically conductive structures 222 can be subsequently recessed below the horizontal plane including the top surface of the template material layer 213. In one embodiment, an etch process can be employed to vertically recess the top surfaces of the metal electrically conductive structures 222. For example, a chlorine-based dry etch process or a HCl-based wet etch process can be employed to recess the top surfaces of the metal electrically conductive structures 222. Alternatively, slurry chemistry modulation can be employed during the chemical mechanical planarization that removes the materials of the first metallic liner layer 221L and the metal layer 223L so that an over-polishing below the horizontal plane can occur during a terminal portion of the chemical mechanical planarization process. The recess depth, as measured between the recessed top surfaces of the metal electrically conductive structures 222 and the horizontal plane including the top surface of the template material layer 213, can be in a range from 1 nm to 30 nm, such as from 3 nm to 10 nm, although lesser and greater recess depths can also be employed.

Figure 22:
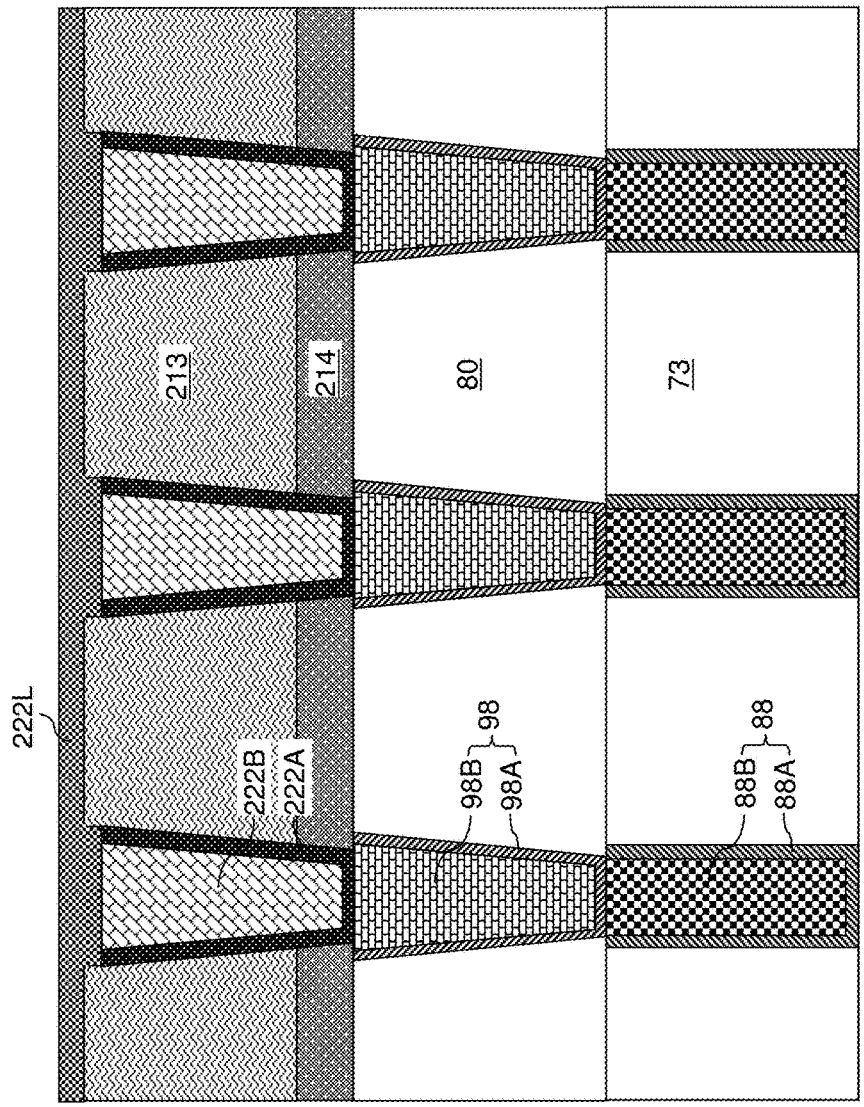
FIG. 22 is a vertical cross-sectional view of the second configuration of the exemplary structure after formation of a second continuous metallic liner layer according to the second embodiment of the present disclosure.

Referring to FIG. 22, a surface cleaning process can be optionally performed to remove surface metal oxide from the physically exposed surfaces of the metal portions 222B and the first metallic liners 222A.

A second metallic liner layer 222L can be deposited by a metal deposition process, which can be a non-selective metal deposition process such as chemical vapor deposition process. In one embodiment, the second metallic liner layer 222L can include aluminum or a cobalt-containing metallic material such as elemental cobalt or a cobalt-containing alloy such as CoW or CoWP. The cobalt-containing metallic material can function as a diffusion barrier layer for copper, which can be the material of the metal portions 222B. Further, the cobalt-containing metallic material can provide strong adhesion to the metal portions 222B. The cobalt-containing metallic material can provide a high electromigration (EM) activation energy in a range from 1.9 eV to 2.4 eV, which is higher than the EM activation energy of 0.9 eV~1.0 eV for a tantalum-copper interface or a titanium-copper interface. Further, chemical vapor deposition process provides conformal deposition, and thus, the thickness of the second metallic liner layer 222L can be uniform throughout.

In one embodiment, the cobalt-containing metallic material can be deposited in a chemical vapor deposition process employing a cobalt precursor such as $Co_2(CO)_8$ as a reactant. Additional reactants may be provided into a process chamber concurrently with, or alternately with, the cobalt precursor to form a CoW film or a CoWP film instead of a cobalt film. Presence of oxygen in the precursors during the CoW or CoWP deposition can cause formation of tungsten oxide. The existence of tungsten oxide (which is an insulator) increases the resistivity of the CoW or CoWP film. In this case, the second metallic liner layer 222L can be annealed in a reducing environment at an elevated temperature. For example, the anneal process at a reducing environment can be performed at a temperature in a range from 400 degrees to 600 degrees for a duration from 1 minute to 10 minutes. Alternatively, oxygen-free precursors can be employed to form a CoW or CoWP film that is substantially free of oxygen.

Figure 23:
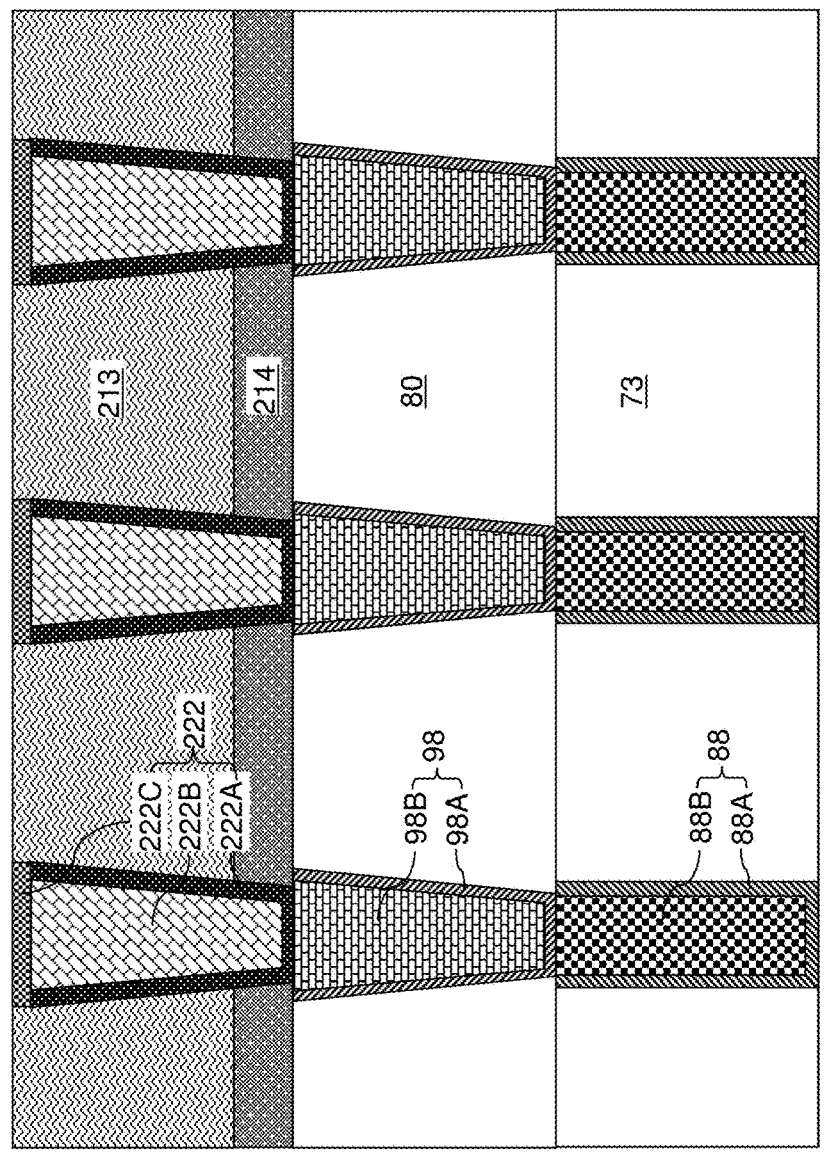
FIG. 23 is a vertical cross-sectional view of the second configuration of the exemplary structure after formation of second metallic liners according to the second embodiment of the present disclosure.

Referring to FIG. 23, a planarization process (such as chemical mechanical planarization process) can be performed to remove portions of the second metallic liner layer 222L from above the horizontal plane including the top surface of the template material layer 213. Each remaining horizontal portion of the second metallic liner layer 222L constitutes a second metallic liner 222C, which is incorporated into an underlying metal electrically conductive structure 222. Thus, each metal electrically conductive structure 222 can include a first metallic liner 222A, a metal portion 222B, and a second metallic liner 222C.

Each second metallic liner 222C is formed on the top surface of an underlying metal portion 222B, and does not contact any sidewall of the metal portion 222B. Each second metallic liner 222C can contact a top surface of an underlying first metallic liner 222A, which can have an annular shape. The thickness of the second metallic liner 222C can be in a range from 1 nm to 30 nm, such as from 3 nm to 10 nm, although lesser and greater thicknesses can also be employed. The first metallic material of the first metallic liners 222A and the second metallic material of the second metallic liners 222C can differ in composition. For each metal portion 222B, a first metallic liner 222A and a second metallic liner 222C can contact an entirety of all surfaces of the metal portion 222B.

Figure 24:
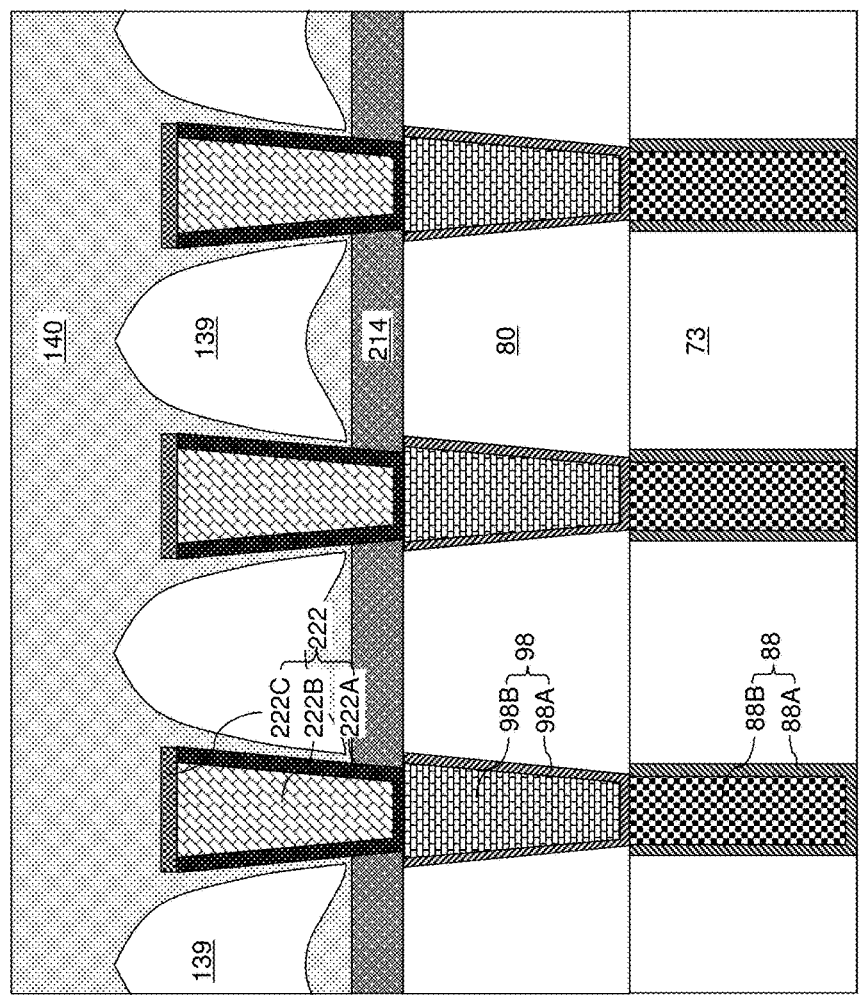
FIG. 24 is a vertical cross-sectional view of the second configuration of the exemplary structure after formation of an air-gap dielectric layer according to the second embodiment of the present disclosure.

Referring to FIG. 24, the template material layer 213 can be removed selective to the first dielectric material layer 214 and the metal electrically conductive structures 222 by an etch process, which may be an isotropic etch process or an anisotropic etch process. For example, a wet etch process, a chemical dry etching (CDE) process, or ashing can be employed to remove the template material layer 213. The top surface of the first dielectric material layer 214 is physically exposed after removal of the template material layer 213. Generally, the topmost layer within the at least one dielectric material layer (213, 214), such as the template material layer 213, can be recessed below a horizontal plane including the top surface of the second metallic liners 222C. In one embodiment, the template material layer 213 can be removed completely.

An additional dielectric material layer can be deposited on the metal electrically conductive structures 222 and over the first dielectric material layer 214. The additional dielectric material layer is herein referred to as a second dielectric material layer 140, which can be the same as the second dielectric material layer 140 of the first configuration. In one embodiment, the second dielectric material layer 140 includes an air-gap dielectric layer. The air-gap dielectric layer which comprises the second dielectric material layer 140 can be formed by anisotropic deposition of a dielectric material with highly anisotropic deposition characteristics. In one embodiment, the second dielectric material layer 140 can be deposited by plasma enhanced chemical vapor deposition (PECVD).

In one embodiment, the dielectric material of the air-gap dielectric layer, which comprises the second dielectric material layer 140, surrounds each of the at least one cavity 139, physically contacts each of the second metallic liners 222C, and does not physically contact the first metallic liners 222A. The first dielectric material layer 214 laterally surrounds the first metallic liners 222A, and the second dielectric material layer 140 laterally surrounds the second metallic liner 222C. The second dielectric material layer 140 can include the same material as, or can include a different material from, the first dielectric material layer 214. In one embodiment, the second dielectric material layer 140 can include a material having a different dielectric constant different from the first dielectric material layer 214. In an illustrative example, the first dielectric material layer 214 can include silicon nitride, doped or undoped silicate glass, organosilicate glass, or a dielectric metal oxide, and the second dielectric material layer 140 can include SiCN or a hydrogen-containing and/or porous derivative thereof. The at least one cavity 139 may be formed as a plurality of discrete cavities or as a single cavity that laterally surrounds each of the metal electrically conductive structures 222. In one embodiment, the at least one cavity 139 can provide above the horizontal plane including the top surfaces of the metal electrically conductive structures 222 at multiple locations.

The second configuration of the exemplary structure can include an electrically conductive structure 222 embedded within at least one dielectric material layer (214, 140), wherein the electrically conductive structure 222 comprises: a metal portion 222B consisting essentially of an elemental metal or an intermetallic alloy of at least two elemental metals; a first metallic liner 222A comprising a first metallic material and contacting a bottom surface of the metal portion 222B and at least lower portions of sidewalls of the metal portion 222A; and a second metallic liner 222C comprising a second metallic material and contacting a top surface of the metal portion 222B. The first metallic material and the second metallic material differ in composition, and the first metallic liner 222A and the second metallic liner 222C contact an entirety of all surfaces of the metal portion 222B. The second metallic liner 222C can contact upper portions of the sidewalls of the metal portion 222B. In one embodiment, the second metallic liner 122C consists essentially of elemental cobalt, CoW, or CoWP.

The air-gap dielectric layer which comprises the second dielectric material layer 140 can comprise a dielectric material that surrounds each of the at least one cavity 139, physically contacts the second metallic liners 222C, and does not physically contact the first metallic liners 222A.

Figure 25:
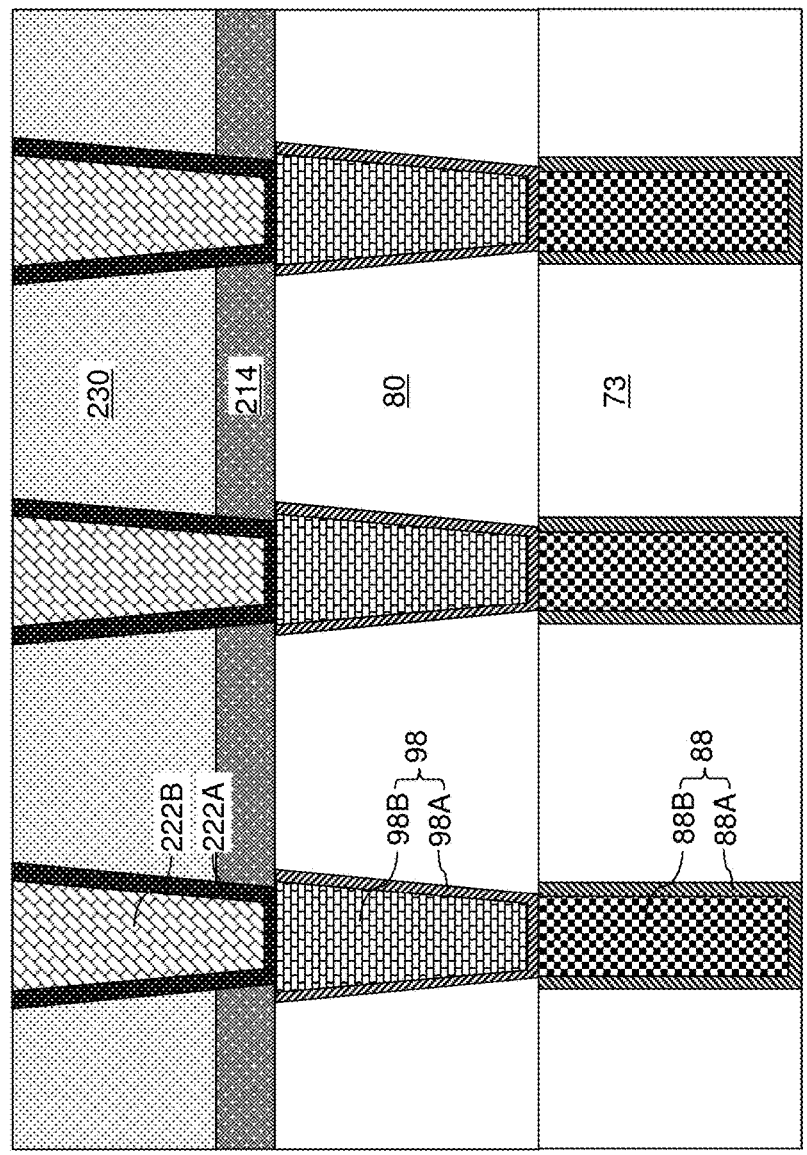
FIG. 25 is a vertical cross-sectional view of a third configuration of the exemplary structure according to the third embodiment of the present disclosure after planarizing the metal layer.

Referring to FIG. 25, a third configuration of the exemplary structure according to a third embodiment of the present disclosure can be derived from the structure of FIG. 20 by planarizing the metal layer 223L without subsequently recessing the planarized metal layer 223L below the top surface of the template material layer 213 (which is shown in FIG. 21). As shown in FIG. 25, the tops of the metal portions 222B are co-planar with the top surface of the template material layer 213.

Figure 26:
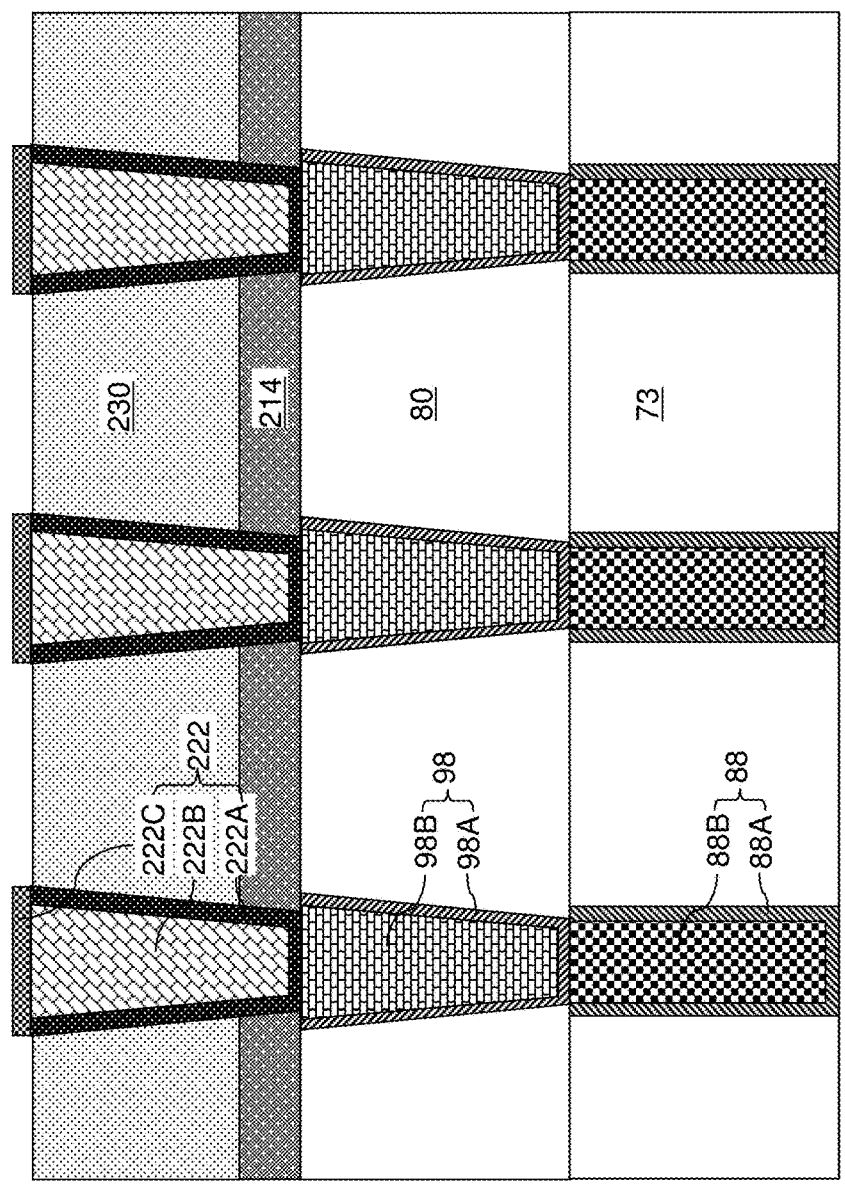
FIG. 26 is a vertical cross-sectional view of a third configuration of the exemplary structure after selectively forming the second metallic liner according to the third embodiment of the present disclosure.

As show in FIG. 26, a selective deposition process is employed to deposit a second metallic liner 222C, such as an aluminum or cobalt-containing metallic material only on physically exposed metallic surfaces of the metal electrically conductive structures (222A, 222B), without growing the liner material on dielectric surfaces such as the top surface of the template material layer 213, using the selective deposition methods described above. A second metallic liner 222C is formed on each physically exposed top surface of the metal portions 222B and the first metallic liners 222A. In one embodiment, the second metallic liners 222C can include a cobalt-containing metallic material such as elemental cobalt or a cobalt-containing alloy such as CoW or CoWP. Alternatively, the second metallic liners 222C can comprise aluminum liners as described above. The process then proceeds as illustrated in FIG. 24 to remove the template material layer 213 and form the air-gap dielectric layer 140 containing the air gaps 139.

Figure 27:
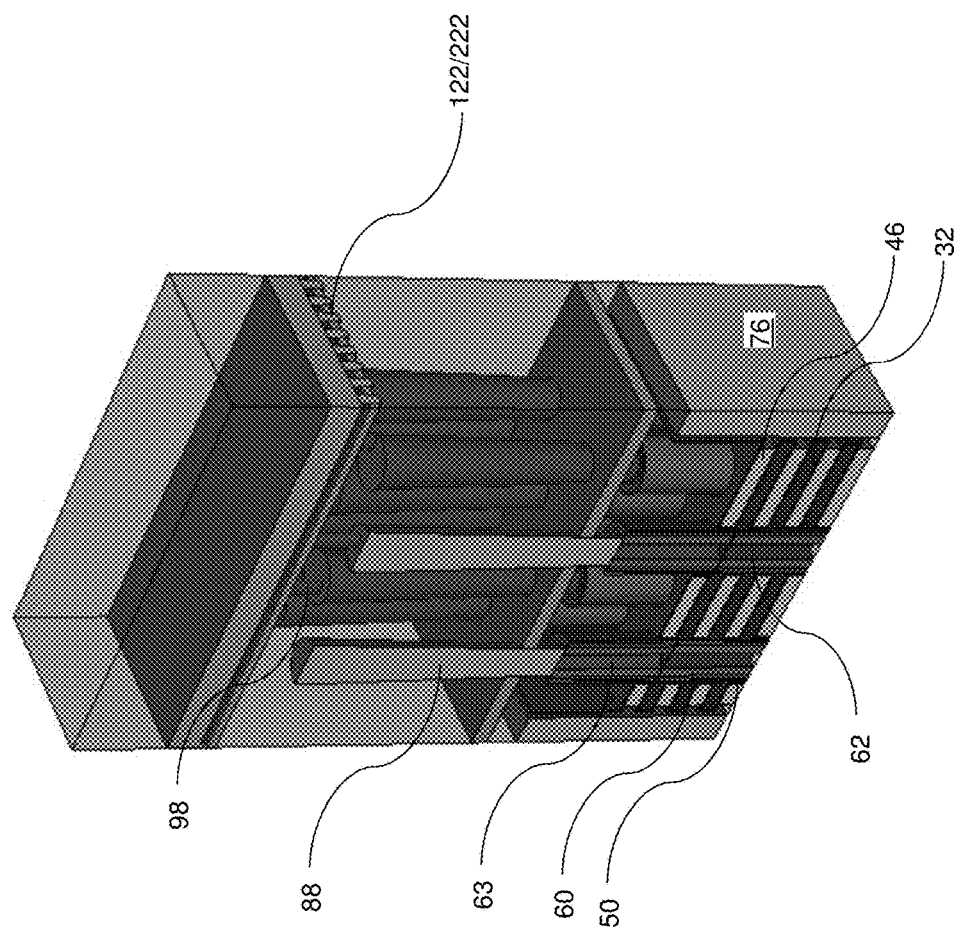
FIG. 27 is a perspective view of an embodiment of the exemplary structure of the present disclosure.

FIG. 27 shows a perspective view of the exemplary structure. In one embodiment, the metal electrically conductive structures (122, 222) of the various configurations of the exemplary structure can be formed as bit lines for the memory stack structures 55, and can be electrically shorted to a respective set of drain regions 63 using the intermediate level metal electrically conductive structures 98 and the drain contact via structures 88.

An exemplary layout of various components is illustrated in FIG. 28, in which the bit lines (122, 222) laterally extend along a bit line horizontal direction that is perpendicular to the lengthwise direction of the backside contact via structures 76 and the lengthwise direction of the word lines (e.g., the middle electrically conductive layers 46 which extend in the word line horizontal direction). The intermediate level metal electrically conductive structures 98 can be employed as via structures that contacts a top surface of a respective one of the drain contact via structures 88 and a bottom surface of a respective one of the bit lines (122, 222). The design of the layout can be selected such that only one drain region 63 is electrically shorted to any of the bit lines (122, 222) between each neighboring pair of backside contact via structures 76. If drain select gate electrodes (i.e., the upper electrically conductive layers 46 which are not separately labeled) are employed, more than two of the drain regions 63 controlled by different drain select gate electrodes can be electrically shorted to a same bit line (122, 222) between each neighboring pair of backside contact via structures 76.

Generally, the at least one dielectric material layer (110, 140, 213 and/or 214) is formed over the alternating stack (32, 46) and the memory stack structures 55. The metal electrically conductive structures (122, 222) including the metal portions (122B, 222B) can be electrically shorted to the respective drain region 63 which is connected to the upper end of one of the vertical semiconductor channels 60. Thus, the alternating stack of insulating layers 32 and electrically conductive layers 46 can be located underneath the at least one dielectric material layer (110, 140, 213 and/or 214); memory stack structures 55 can extend through the alternating stack (32, 46); each of the memory stack structures 55 can comprise a memory film 50 and a vertical semiconductor channel 60 contacting an inner sidewall of the memory film 50; and a metal portion (122B, 222B) can be electrically shorted to the drain region 63 contacting the upper end of one of the vertical semiconductor channels 60.

In one embodiment, the alternating stack (32, 46) comprises a terrace region in which each electrically conductive layer 46 other than a topmost electrically conductive layer 46 within the alternating stack (32, 46) laterally extends farther than an overlying electrically conductive layer 46 within the alternating stack (32, 46); the terrace region includes stepped surfaces of the alternating stack (32, 46) that continuously extend from a bottommost layer within the alternating stack (32, 46) to a topmost layer within the alternating stack (32, 46); and support pillar structures 20 extend through the stepped surfaces and through a retro-stepped dielectric material portion 65 that overlies the stepped surfaces and underlies the at least one dielectric material layer (110, 140, 213 and/or 214).

The exemplary structures can include a three-dimensional memory device. In one embodiment, the three-dimensional memory device comprises a monolithic three-dimensional NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit (as embodied as a subset of the least one semiconductor device 700) for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10) and comprising a respective one of the vertical semiconductor channels 60; and a plurality of charge storage elements (as embodied as portions of the memory films 50, i.e., portions of the charge storage layer 54). Each charge storage element can be located adjacent to a respective one of the plurality of semiconductor channels (59, 11, 60).

The multiple liners of the embodiments of the present disclosure provide the following non-limiting advantages. The liners prevent or reduce copper bit line diffusion (i.e., movement) and reflow during subsequent processing step and act as diffusion barrier layers for the copper bit lines. The multiple liners reduce word line shorts due to copper reflow and provide a low cost barrier fabrication process. The air gaps located between the liners reduce the device RC time constant and increase isolation between adjacent bit lines.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A structure comprising an electrically conductive structure embedded within at least one dielectric material layer, wherein the electrically conductive structure comprises:
   a metal portion consisting essentially of an elemental metal or an intermetallic alloy of at least two elemental metals;
   a first metallic liner comprising a first metallic material and contacting a bottom surface of the metal portion and at least lower portions of sidewalls of the metal portion; and
   a second metallic liner comprising a second metallic material and contacting a top surface of the metal portion,
   wherein:
   the first metallic material and the second metallic material differ in composition; and
   the first metallic liner and the second metallic liner contact an entirety of all surfaces of the metal portion; and
   wherein the structure comprises at least one feature selected from:
   a first feature that the metal portion comprises copper and the second metallic liner consists essentially of aluminum;
   a second feature that the metal portion comprises copper and the second metallic liner comprises a material selected from cobalt, cobalt-tungsten and cobalt-tungsten-phosphorus;
   a third feature that the first metallic liner comprises a material selected from a conductive metallic nitride and an elemental transition metal;
   a fourth feature that the metal portion comprises copper, the first metallic liner comprises titanium and the second metallic liner comprises aluminum; or
   the fifth feature that the at least one dielectric material layer comprises an air-gap dielectric layer including at least one cavity filled with vacuum or a gas phase material.

2. The structure of claim 1, wherein the second metallic liner further contacts upper portions of the sidewalls of the metal portion.

3. The structure of claim 1, wherein:
   the first metallic liner further contacts upper portions of the sidewalls of the metal portion; and
   an interface between the first metallic liner and the second metallic liner is located within a plane including a top surface of the metal portion.

4. The structure of claim 1, wherein the structure comprises the first feature.

5. The structure of claim 1, wherein the structure comprises the second feature.

6. The structure of claim 1, wherein the structure comprises the third feature.

7. The structure of claim 1, wherein the structure comprises the fourth feature.

8. The structure of claim 1, wherein the structure comprises the fifth feature.

9. The structure of claim 8, wherein the air-gap dielectric layer comprises a dielectric material that surrounds each of the at least one cavity, physically contacting the second metallic liner, and not physically contacting the first metallic liner.

10. The structure of claim 1, further comprising:
    an alternating stack of insulating layers and electrically conductive word line layers located underneath the at least one dielectric material layer;
    memory stack structures extending through the alternating stack, wherein each of the memory stack structures comprises a memory film and a vertical semiconductor channel contacting an inner sidewall of the memory film, wherein the metal portion is electrically shorted to a drain region contacting an upper end of one of the vertical semiconductor channels.

11. The structure of claim 10, wherein:
the structure comprises a three-dimensional NAND memory device; and
the electrically conductive structure comprises a bit line.

12. A method of forming a structure, comprising:
forming at least one dielectric material layer over a substrate;
forming an opening through the at least one dielectric material layer;
forming a first metallic liner on a bottom surface and sidewalls of the opening by depositing a first metallic material;
forming a metal portion consisting essentially of an elemental metal or an intermetallic alloy of at least two elemental metals on the first metallic liner; and
forming a second metallic liner comprising a second metallic material directly on a top surface of the metal portion,
wherein:
the first metallic material and the second metallic material differ in composition;
the first metallic liner and the second metallic liner contact an entirety of all surfaces of the metal portion; and
the method comprises at least one feature selected from:
a first feature that the method further comprises recessing a top surface of a topmost layer of the at least one dielectric material layer, wherein the second metallic liner is formed on upper portions of the sidewalls of the metal portion, and wherein the second metallic liner is deposited by a selective deposition process that deposits the second metallic material on metallic surfaces and does not deposit the second metallic material on dielectric surfaces;
a second feature that the method further comprises recessing a top surface of a topmost layer of the at least one dielectric material layer, wherein the second metallic liner is formed on upper portions of the sidewalls of the metal portion, and wherein the metal portion comprises copper and the second metallic liner consists essentially of aluminum; or
a third feature that the method further comprises:
forming an alternating stack of insulating layers and electrically conductive word line layers of a three-dimensional NAND memory device over the substrate;
forming memory stack structures through the alternating stack, wherein each of the memory stack structures comprises a memory film and a vertical semiconductor channel contacting an inner sidewall of the memory film;
at least partially removing a topmost portion of the at least one dielectric material layer below a horizontal plane including a top surface of the second metallic liner; and
forming an air-gap dielectric layer including at least one cavity filled with vacuum or a gas phase material;
wherein:

the at least one dielectric material layer is formed over the alternating stack and the memory stack structures;
the metal portion is electrically shorted to a drain region contacting an upper end of one of the vertical semiconductor channels; and
the metal portion, the first metallic liner and the second metallic liner comprise a bit line of the three-dimensional NAND memory device.

13. The method of claim 12, wherein the method comprises the third feature.

14. The method of claim 12, wherein the method comprises the first feature.

15. The method of claim 12, wherein the method comprises the second feature.

16. A method of forming a structure, comprising:
forming at least one dielectric material layer over a substrate;
forming an opening through the at least one dielectric material layer;
forming a first metallic liner on a bottom surface and sidewalls of the opening by depositing a first metallic material;
forming a metal portion consisting essentially of an elemental metal or an intermetallic alloy of at least two elemental metals on the first metallic liner;
recessing a top surface of a topmost layer of the at least one dielectric material layer; and
forming a second metallic liner comprising a second metallic material directly on a top surface of the metal portion,
wherein:
the second metallic liner is formed on upper portions of the sidewalls of the metal portion;
the first metallic material and the second metallic material differ in composition;
the first metallic liner and the second metallic liner contact an entirety of all surfaces of the metal portion; and
the second metallic liner is deposited on the top surface of the metal portion while the first metallic liner contacts an entirety of sidewalls of the metal portion; and
wherein the method further comprises at least one feature selected from:
a first feature that the metal portion is formed by depositing the metal or the intermetallic alloy in the opening and on the first metallic liner, by removing the metal or the intermetallic alloy from above a horizontal plane including a topmost surface of the at least one dielectric material layer, and by recessing the metal or the intermetallic alloy below the horizontal plane, and the second metallic liner is deposited by a non-selective deposition process that deposits the second metallic material, and by removing the second metallic material from above the horizontal plane;
a second feature that the metal portion is formed by depositing the metal or the intermetallic alloy in the opening and on the first metallic liner, and by removing the metal or the intermetallic alloy from above a horizontal plane including a topmost surface of the at least one dielectric material layer, and the second metallic liner is deposited by a selective deposition process that deposits the second metallic material on metallic surfaces and does not deposit the second metallic material on dielectric surfaces; or a third feature that the metal portion comprises copper and the second metallic liner comprises a material selected from cobalt, cobalt-tungsten and cobalt-tungsten-phosphorus.

17. The method of claim 16, wherein the method comprises the first feature.

18. The method of claim 16, wherein the method comprises the second feature.

19. The method of claim 16, wherein the method comprises the third feature.

* * * * *